United States Patent
Ito et al.

(10) Patent No.: US 10,396,747 B2
(45) Date of Patent: Aug. 27, 2019

(54) TEMPERATURE COMPENSATED OSCILLATION CIRCUIT, OSCILLATOR, ELECTRONIC APPARATUS, VEHICLE, AND METHOD OF MANUFACTURING OSCILLATOR

(71) Applicant: Seiko Epson Corporation, Tokyo (JP)

(72) Inventors: Hisahiro Ito, Minowa (JP); Yuichi Toriumi, Fujimi (JP); Nobutaka Shiozaki, Shiojiri (JP)

(73) Assignee: Seiko Epson Corporation (JP)

( * ) Notice: Subject to any disclaimer, the term of this patent is extended or adjusted under 35 U.S.C. 154(b) by 124 days.

(21) Appl. No.: 15/613,860

(22) Filed: Jun. 5, 2017

(65) Prior Publication Data

US 2017/0353171 A1  Dec. 7, 2017

(30) Foreign Application Priority Data

Jun. 7, 2016 (JP) ................ 2016-113223

(51) Int. Cl.
| | |
|---|---|
| *B06B 1/06* | (2006.01) |
| *H03B 5/12* | (2006.01) |
| *H03B 5/32* | (2006.01) |
| *H03H 3/04* | (2006.01) |
| *H03H 9/05* | (2006.01) |
| *H03H 9/08* | (2006.01) |
| *H03H 9/17* | (2006.01) |

(Continued)

(52) U.S. Cl.
CPC ............. *H03H 3/04* (2013.01); *B06B 1/06* (2013.01); *H03B 5/1206* (2013.01); *H03B 5/32* (2013.01); *H03H 9/0547* (2013.01); *H03H 9/08* (2013.01); *H03H 9/125* (2013.01); *H03H 9/17* (2013.01); *H03H 9/562* (2013.01); *H03H 2003/0414* (2013.01)

(58) Field of Classification Search
CPC ............. H03H 3/04; H03H 9/17; H03H 9/125; H03H 9/562
See application file for complete search history.

(56) References Cited

U.S. PATENT DOCUMENTS

| | | |
|---|---|---|
| 4,910,473 A | 3/1990 | Niwa |
| 5,604,468 A | 2/1997 | Gillig |

(Continued)

FOREIGN PATENT DOCUMENTS

| | | |
|---|---|---|
| JP | 63-035017 A | 2/1988 |
| JP | 01-091529 A | 4/1989 |

(Continued)

*Primary Examiner* — Jeffrey M Shin
(74) *Attorney, Agent, or Firm* — Harness, Dickey & Pierce, P.L.C.

(57) ABSTRACT

A temperature compensated oscillation circuit includes an oscillation circuit that oscillates a resonator, a fractional N-PLL circuit that multiplies frequency of an oscillation signal which is output by the oscillation circuit, on the basis of a frequency division ratio which is input, a temperature measurement unit that measures temperature, and a storage unit that stores a temperature correction table for correcting frequency temperature characteristics of the oscillation signal, in which the frequency division ratio of the fractional N-PLL circuit is set on the basis of a measurement value obtained by the temperature measurement unit and the temperature correction table.

12 Claims, 14 Drawing Sheets

(51) Int. Cl.
*H03H 9/56* (2006.01)
*H03H 9/125* (2006.01)

(56) References Cited

U.S. PATENT DOCUMENTS

| | | | |
|---|---|---|---|
| 6,081,164 A * | 6/2000 | Shigemori | G06F 1/08 |
| | | | 257/E23.059 |
| 6,154,095 A * | 11/2000 | Shigemori | H03K 3/0307 |
| | | | 331/158 |
| 6,515,548 B2 | 2/2003 | Matsumoto et al. | |
| 7,154,351 B2 | 12/2006 | Kawasaki et al. | |
| 2011/0187422 A1 * | 8/2011 | Hammes | H03L 1/026 |
| | | | 327/156 |

FOREIGN PATENT DOCUMENTS

| | | |
|---|---|---|
| JP | 2000-509219 A | 7/2000 |
| JP | 2001-339244 A | 12/2001 |
| WO | WO-97-40580 A1 | 10/1997 |
| WO | WO-2004-025824 A1 | 3/2004 |

* cited by examiner

261

| TEMPERATURE MEASUREMENT VALUE DT (ADDRESS) | INTEGER FREQUENCY DIVISION RATIO N | FRACTION FREQUENCY DIVISION RATIO F/M |
|---|---|---|
| 0 | X0 | Y0 |
| 1 | X1 | Y1 |
| 2 | X2 | Y2 |
| 3 | X3 | Y3 |
| 4 | X4 | Y4 |
| 5 | X5 | Y5 |
| 6 | X6 | Y6 |
| 7 | X7 | Y7 |
| 8 | X8 | Y8 |
| ... | | |
| 244 | X244 | Y244 |
| 245 | X245 | Y245 |
| 246 | X246 | Y246 |
| 247 | X247 | Y247 |
| 248 | X248 | Y248 |
| 249 | X249 | Y249 |
| 250 | X250 | Y250 |
| 251 | X251 | Y251 |
| 252 | X252 | Y252 |
| 253 | X253 | Y253 |
| 254 | X254 | Y254 |
| 255 | X255 | Y255 |

| ADDRESS ADR | TEMPERATURE MEASUREMENT VALUE DT | INTEGER FREQUENCY DIVISION RATIO N' | FRACTION FREQUENCY DIVISION RATIO F/M' |
|---|---|---|---|
| 0 | 0 | X0 | Y0 |
| 1 | 4 | X4 | Y4 |
| 2 | 8 | X8 | Y8 |
| ⋮ | ⋮ | ⋮ | ⋮ |
| 61 | 244 | X244 | Y244 |
| 62 | 248 | X248 | Y248 |
| 63 | 252 | X252 | Y252 |

FIG. 14

TEMPERATURE COMPENSATED OSCILLATION CIRCUIT, OSCILLATOR, ELECTRONIC APPARATUS, VEHICLE, AND METHOD OF MANUFACTURING OSCILLATOR

BACKGROUND

1. Technical Field

The present invention relates to a temperature compensated oscillation circuit, an oscillator, an electronic apparatus, a vehicle, and a method of manufacturing the oscillator.

2. Related Art

Temperature compensated crystal oscillators (TCXO) include a quartz crystal resonator and a temperature compensated oscillation circuit for oscillating the quartz crystal resonator, and the temperature compensated oscillation circuit compensates (temperature compensation) for a deviation (frequency deviation) from a desired frequency (nominal frequency) of an oscillation frequency of the quartz crystal resonator in a predetermined temperature range, thereby obtaining high frequency accuracy. Such a temperature compensated crystal oscillator (TCXO) is disclosed in, for example, International Publication No. WO2004/025824.

However, in the temperature compensated crystal oscillator (TCXO) of the related art as disclosed in International Publication No. WO2004/025824, a temperature sensor is required to have high accuracy of measurement in order to realize high frequency accuracy (small frequency deviation) and is required to adjust so as to output a predetermined value at a predetermined temperature and to calculate a temperature compensation coefficient in a state where the temperature of the oscillator is accurately stabilized at a plurality of desired temperatures in a manufacturing step thereof, and thus it is difficult to reduce a manufacturing cost.

SUMMARY

An advantage of some aspects of the invention is to provide a temperature compensated oscillation circuit which is usable to realize an oscillator having a small frequency deviation depending on temperature while reducing a manufacturing cost. In addition, according to some aspects of the invention, it is possible to provide an oscillator having a small frequency deviation depending on temperature while reducing a manufacturing cost. In addition, according to some aspects of the invention, it is possible to provide an electronic apparatus and a vehicle which use the oscillator. In addition, according to some aspects of the invention, it is possible to provide a method of manufacturing the oscillator which is capable of realizing the oscillator having a small frequency deviation at a low cost.

The invention can be implemented as the following embodiments or application examples.

Application Example 1

A temperature compensated oscillation circuit according to this application example includes an oscillation circuit that oscillates a resonator, a fractional N-PLL circuit that multiplies frequency of an oscillation signal which is output by the oscillation circuit, on the basis of a frequency division ratio which is input, a temperature measurement unit that measures temperature, and a storage unit that stores a temperature correction table for correcting frequency temperature characteristics of the oscillation signal, in which frequency division ratio of the fractional N-PLL circuit is set on the basis of a measurement value obtained by the temperature measurement unit and the temperature correction table.

In the temperature compensated oscillation circuit according to the application example, the frequency division ratio of the fractional N-PLL circuit for correcting the frequency temperature characteristic of the oscillation signal is set in association with the measurement value obtained by the temperature measurement unit. Accordingly, when a correspondence relationship between the actual temperature and a temperature measurement value does not fluctuate even when absolute measurement accuracy of the temperature measurement unit is low, it is possible to output an oscillation signal with a small frequency deviation of which the frequency temperature characteristics are corrected. Therefore, it is possible to realize the oscillator having a small frequency deviation depending on temperature by using the temperature compensated oscillation circuit according to the application example. In addition, since it is not also necessary to accurately stabilize the temperature of the oscillator at a plurality of desired temperatures to thereby create the temperature correction table by using the temperature compensated oscillation circuit according to the application example, the number of manufacturing steps is reduced, and thus it is possible to reduce a manufacturing cost of the oscillator.

Application Example 2

The temperature compensated oscillation circuit according to the application example may further include a terminal, a control unit that is capable of setting an update mode for updating the temperature correction table, and a temperature correction table updating unit that updates the temperature correction table in the update mode on the basis of an output signal of the fractional N-PLL circuit and a reference clock signal which is input from the terminal.

Application Example 3

In the temperature compensated oscillation circuit according to the application example, the temperature correction table updating unit may calculate the frequency division ratio for bringing frequency of the output signal of the fractional N-PLL circuit close to frequency of the reference clock signal in the update mode, and may update the temperature correction table on the basis of the frequency division ratio.

The temperature compensated oscillation circuit according to these application examples is set to be in the update mode, and thus automatically updates (creates) the temperature correction table on the basis of the reference clock signal which is input from the terminal. Therefore, an inspection apparatus does not need to perform a process of creating the temperature correction table and can simultaneously manufacture a plurality of oscillators by using the temperature compensated oscillation circuit according to the application example, and thus it is possible to reduce a manufacturing cost of the oscillator.

Application Example 4

The temperature compensated oscillation circuit according to the application example may further include a frequency division ratio calculation unit that calculates the frequency division ratio corresponding to the measurement value obtained by the temperature measurement unit by using a plurality of the frequency division ratios described in the temperature correction table, in a case where the frequency division ratio corresponding to the measurement value is not described in the temperature correction table.

For example, in a case where the frequency division ratio corresponding to the measurement value obtained by the temperature measurement unit is not described in the temperature correction table, the frequency division ratio calculation unit may perform complementary calculation of the frequency division ratio corresponding to the measurement value obtained by the temperature measurement unit by using the frequency division ratios, corresponding to a measurement value smaller than the measurement value obtained by the temperature measurement unit and a measurement value larger than the measurement value obtained by the temperature measurement unit, which are described in the temperature correction table.

In the temperature compensated oscillation circuit according to this application example, approximate calculation of a frequency division ratio corresponding to a measurement value which is not described in the temperature correction table is performed, and thus it is possible to reduce the size of the temperature correction table. Therefore, it is possible to reduce a manufacturing cost of the oscillator by using the temperature compensated oscillation circuit according to the application example.

Application Example 5

An oscillator according to this application example includes any one of the above-described temperature compensated oscillation circuits, and the resonator.

According to this application example, since the frequency division ratio of the fractional N-PLL circuit for correcting the frequency temperature characteristics of the oscillation signal is set in association with the measurement value obtained by the temperature measurement unit, it is possible to realize the oscillator having a small frequency deviation while reducing a manufacturing cost by using the temperature compensated oscillation circuit capable of outputting the oscillation signal having a small frequency deviation even when the accuracy of measurement of the temperature measurement unit is low.

Application Example 6

An electronic apparatus according to this application example includes the above-described oscillator.

Application Example 7

A vehicle according to this application example includes the above-described oscillator.

According to these application examples, it is possible to realize the electronic apparatus and vehicle, having higher reliability, which include the oscillator having a small frequency deviation.

Application Example 8

A method of manufacturing an oscillator according to this application example includes assembling the oscillator that includes a terminal, a resonator, and a temperature compensated oscillation circuit, the temperature compensated oscillation circuit being provided with an oscillation circuit that oscillates the resonator, a fractional N-PLL circuit that multiplies frequency of an oscillation signal which is output by the oscillation circuit on the basis of a frequency division ratio which is input, a temperature measurement unit that measures temperature, a storage unit that stores a temperature correction table for correcting frequency temperature characteristics of the oscillation signal, a control unit that is capable of setting an update mode for updating the temperature correction table, and a temperature correction table updating unit that updates the temperature correction table on the basis of an output signal of the fractional N-PLL circuit and a reference clock signal which is input from the terminal, and the frequency division ratio of the fractional N-PLL circuit being set on the basis of a measurement value obtained by the temperature measurement unit and the temperature correction table, setting the temperature compensated oscillation circuit to be in the update mode, and inputting the reference clock signal to the terminal to thereby change temperature of the oscillator in a predetermined range.

According to the method of manufacturing an oscillator according to this application example, the temperature compensated oscillation circuit is set to be in the update mode, and thus the temperature correction table for correcting frequency temperature characteristics of the oscillation signal in a predetermined temperature range is automatically updated (created) on the basis of the reference clock signal. Therefore, an inspection apparatus does not need to perform a process of creating the temperature correction table and can simultaneously manufacture a plurality of oscillators by using the temperature compensated oscillation circuit according to the application example, and thus it is possible to reduce a manufacturing cost of the oscillator.

BRIEF DESCRIPTION OF THE DRAWINGS

The invention will be described with reference to the accompanying drawings, wherein like numbers reference like elements.

FIG. 7 is a diagram illustrating an example of a configuration of a temperature correction table according to the first embodiment.

FIG. 14 is a diagram illustrating an example of a configuration of a temperature correction table according to the second embodiment.

DESCRIPTION OF EXEMPLARY EMBODIMENTS

Hereinafter, preferred embodiments of the invention will be described in detail with reference to the accompanying drawings. Meanwhile, the embodiments described below are not unduly limited to the disclosure of the invention described in the appended claims. In addition, all the configurations described below are not necessarily essential components of the invention.

1. Oscillator
1-1. First Embodiment
Configuration of Oscillator

Figure 1:
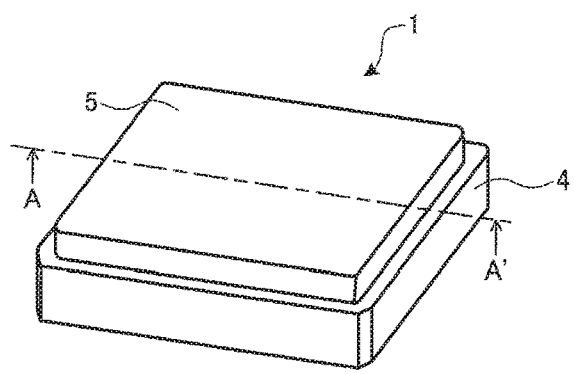
FIG. 1 is a perspective view illustrating an oscillator according to this embodiment.
Figure 2:
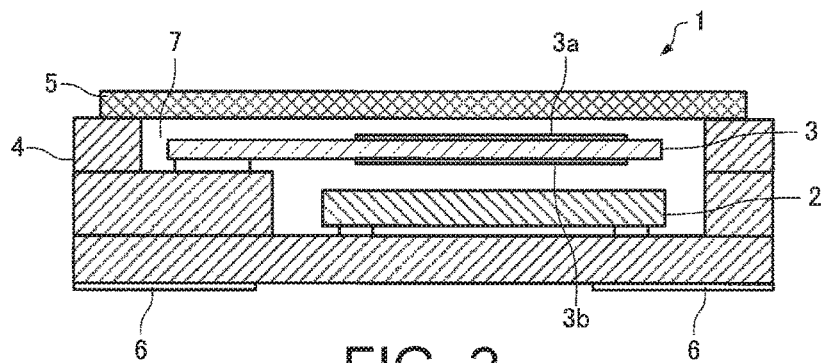
FIG. 2 is a cross-sectional view of the oscillator according to this embodiment.
Figure 3:
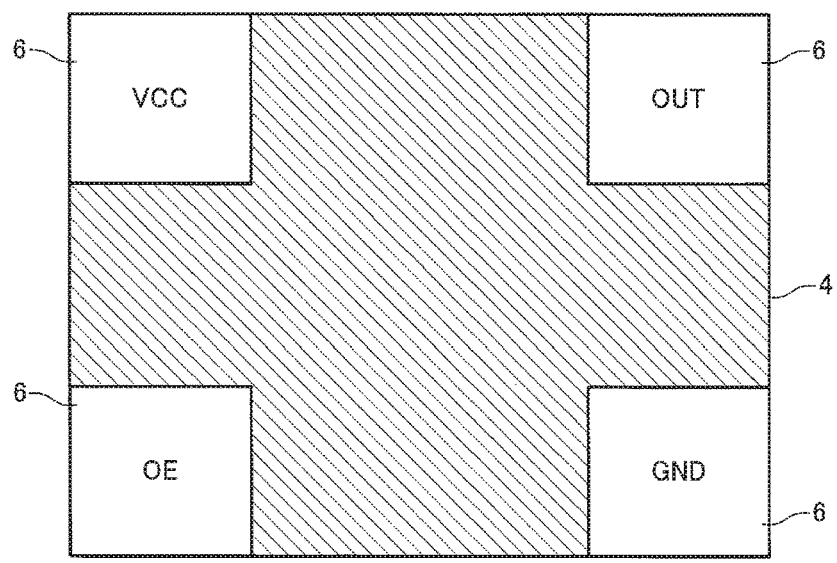
FIG. 3 is a bottom view of the oscillator according to this embodiment.

FIGS. 1 to 3 are diagrams illustrating an example of a structure of an oscillator 1 according to this embodiment. FIG. 1 is a perspective view of the oscillator 1, and FIG. 2 is a cross-sectional view taken along line A-A' of FIG. 1. In addition, FIG. 3 is a bottom view of the oscillator 1.

The oscillator 1 of this embodiment is a temperature compensated oscillator, and is configured to include a temperature compensated oscillation circuit 2, a resonator 3, a package 4, a lid (cover) 5, and external terminals (external electrodes) 6, as illustrated in FIGS. 1 to 3. In this embodiment, it is assumed that the resonator 3 is a quartz crystal resonator, but may be, for example, a surface acoustic wave (SAW) resonator, any of other piezoelectric resonators, micro electro mechanical systems (MEMS) resonator, or the like. In addition, examples of a substrate material of the resonator 3 may include a piezoelectric material such as piezoelectric single crystal, for example, quartz crystal, lithium tantalate, and lithium niobate, or piezoelectric ceramics, for example, lead zirconate titanate, a silicon semiconductor material, and the like. As an excitation unit of the resonator 3, a unit based on a piezoelectric effect may be used, or electrostatic driving based on a Coulomb force may be used.

The package 4 accommodates the temperature compensated oscillation circuit 2 and the resonator 3 in the same space. Specifically, the package 4 is provided with a concave portion, and the concave portion is covered with the lid 5, thereby configuring a housing chamber 7. Wirings, not shown in the drawing, for electrically connecting two terminals (an XG terminal and an XD terminal of FIG. 3 to be described later) of the temperature compensated oscillation circuit 2 and two terminals (excitation electrodes 3a and 3b) of the resonator 3 are provided inside the package 4 or on the surface of the concave portion. In addition, wirings, not shown in the drawing, for electrically connecting the terminals of the temperature compensated oscillation circuit 2 and the corresponding external terminals 6 are provided inside the package 4 or on the surface of the concave portion.

The resonator 3 includes the excitation electrodes 3a and 3b, formed of a metal, on the front and rear surfaces thereof, and oscillates at a desired frequency (target frequency required for the oscillator 1) based on the shape or mass of the resonator 3 including the excitation electrodes 3a and 3b.

As illustrated in FIG. 3, the oscillator 1 is provided with four external terminals 6 of an external terminal VCC which is a power supply terminal, an external terminal GND which is a ground terminal, an external terminal OE which is an input and output terminal, and an external terminal OUT which is an input and output terminal, on the bottom surface thereof (rear surface of the package 4). A power supply voltage is supplied to the external terminal VCC, and the external terminal GND is grounded.

Figure 4:
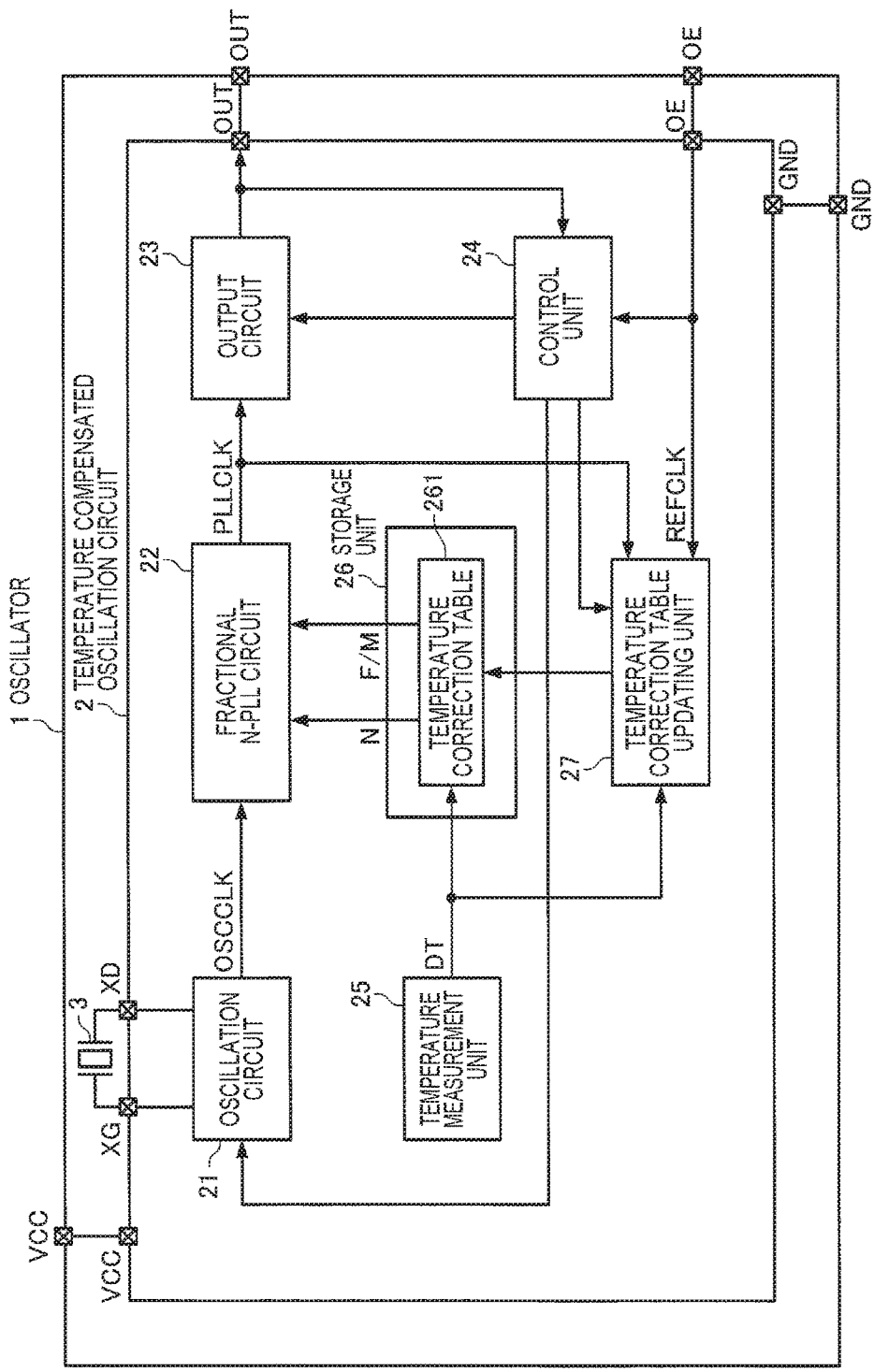
FIG. 4 is a functional block diagram of an oscillator according to a first embodiment.

FIG. 4 is a functional block diagram of the oscillator 1 according to this embodiment. As illustrated in FIG. 4, the oscillator 1 of a first embodiment is configured to include the temperature compensated oscillation circuit 2 and the resonator 3. The temperature compensated oscillation circuit 2 is provided with a VCC terminal which is a power supply terminal, a GND terminal which is a ground terminal, an OE terminal which is an input and output terminal, an OUT terminal which is an input and output terminal, and an XG terminal and an XD terminal which are terminals connected to the resonator 3. The VCC terminal, the GND terminal, the OE terminal, and the OUT terminal are exposed to the surface of the temperature compensated oscillation circuit 2, and are respectively connected to the external terminals VCC, GND, OE, and OUT of the oscillator 1 which are provided in the package 4. In addition, the XG terminal is connected to one end (one terminal) of the resonator 3, and the XD terminal is connected to the other end (the other terminal) of the resonator 3.

In this embodiment, the temperature compensated oscillation circuit 2 is configured to include an oscillation circuit 21, a fractional N-PLL circuit 22, an output circuit 23, a control unit 24, a temperature measurement unit 25, a storage unit 26, and a temperature correction table updating unit 27. Meanwhile, the temperature compensated oscillation circuit 2 may be configured such that a portion of these components is omitted or changed or other components are added.

In this embodiment, the temperature compensated oscillation circuit 2 is configured as an integrated circuit (IC) of one chip, but may be constituted by an integrated circuit (IC) of a plurality of chips or may be partially constituted by a discrete component.

The oscillation circuit 21 oscillates the resonator 3 by amplifying an output signal of the resonator 3 which is input from the XG terminal of the temperature compensated oscillation circuit 2 and feeding back the amplified signal to the resonator 3 through the XD terminal of the temperature compensated oscillation circuit 2, and outputs an oscillation signal (clock signal OSCCLK) based on the oscillation of the resonator 3. For example, the oscillation circuit constituted by the resonator 3 and the oscillation circuit 21 may be various types of oscillation circuits such as a pierced oscillation circuit, an inverter-type oscillation circuit, a Colpitts oscillation circuit, and a Hartley oscillation circuit.

Figure 5:
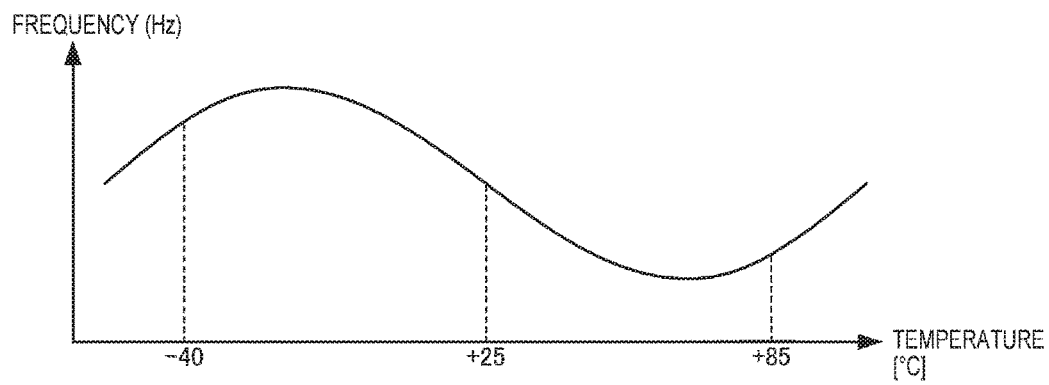
FIG. 5 is a diagram illustrating an example of frequency temperature characteristics of an output signal of an oscillation circuit.

A frequency $f_{OSCCLK}$ of the output signal (clock signal OSCCLK) of the oscillation circuit 21 has frequency temperature characteristics based on temperature characteristics of the resonator 3, and the like. FIG. 5 is a diagram illustrating an example of frequency temperature characteristics of the output signal (clock signal OSCCLK) of the oscillation circuit 21. In FIG. 5, the horizontal axis represents temperature (unit: ° C.), and the vertical axis represents a frequency (unit: Hz). In the example of FIG. 5, the frequency $f_{OSCCLK}$ of the clock signal OSCCLK changes in the form of a substantially cubic curve with respect to temperature with reference temperature (for example, a temperature of approximately +25° C.) as a inflection point, and is not constant in a temperature range (operation guarantee temperature range) (for example, −40° C. to +85° C.) in which the operation of the oscillator 1 is guaranteed.

Referring back to FIG. 4, the fractional N-PLL circuit 22 multiplies the frequency of the oscillation signal (clock signal OSCCLK) which is output by the oscillation circuit 21 on the basis of a frequency division ratio which is input. Specifically, the fractional N-PLL circuit 22 generates a clock signal PLLCLK obtained by multiplying the frequency $f_{OSCCLK}$ of the clock signal OSCCLK which is output by the oscillation circuit 21, on the basis of a frequency division ratio which is input from a temperature correction table 261 stored in the storage unit 26. Here, when an integer portion (integer frequency division ratio) of the frequency division ratio is set to be N and a fraction portion (fraction frequency division ratio) is set to be F/M, the relation of the following expression (1) is established between the frequency $f_{OSCCLK}$ of the clock signal OSCCLK and a frequency $f_{PLLCLK}$ Of the clock signal PLLCLK.

$$f_{PLLCLK} = \left(N + \frac{F}{M}\right) \times f_{OSCCLK} \quad (1)$$

In this embodiment, the fractional N-PLL circuit 22 functions as a circuit that corrects frequency temperature characteristics (see FIG. 5) of the output signal (clock signal OSCCLK) of the oscillation circuit 21, on the basis of the integer frequency division ratio N and the fraction frequency division ratio F/M which are output from the temperature correction table 261. That is, the integer frequency division ratio N and the fraction frequency division ratio F/M which are output from the temperature correction table 261 change depending on a temperature, and the fractional N-PLL circuit 22 operates so as to bring the frequency $f_{PLLCLK}$ of the clock signal PLLCLK close to a target frequency in an operation guarantee temperature range (for example, −40° C. to +85° C.), on the basis of the integer frequency division ratio N and the fraction frequency division ratio F/M. As described later, the frequency division ratio (an integer frequency division ratio N and a fraction frequency division ratio F/M) of the fractional N-PLL circuit 22 is set on the basis of a measurement value (temperature measurement value DT) of the temperature measurement unit 25 and the temperature correction table 261.

Meanwhile, the fractional N-PLL circuit 22 may be a circuit that corrects the frequency temperature characteristics (see FIG. 5) of the clock signal OSCCLK, converts the frequency $f_{OSCCLK}$ into a predetermined frequency $f_{PLLCLK}$ (for example, a frequency two, ½ or the like times frequency $f_{OSCCLK}$), and outputs the converted frequency.

The output circuit 23 receives an input of the clock signal PLLCLK which is output by the fractional N-PLL circuit 22 to thereby generate an oscillation signal of which the amplitude thereof is adjusted to a desired level. The oscillation signal generated by the output circuit 23 is output to the outside of the oscillator 1 through the OUT terminal of the temperature compensated oscillation circuit 2 and the external terminal OUT of the oscillator 1.

The control unit 24 is a circuit that controls operations of the oscillation circuit 21, the output circuit 23, and the temperature correction table updating unit 27. In addition, the control unit 24 can set an operation mode of the oscillator 1 (temperature compensated oscillation circuit 2) to each of a plurality of modes including an external communication mode, a normal operation mode, and a temperature correction table update mode (an example of an update mode for updating a temperature correction table), on the basis of a control signal which is input through a terminal of the temperature compensated oscillation circuit 2 from an external terminal of the oscillator 1, and performs control based on the set operation mode. In this embodiment, in a case where a control signal having a predetermined pattern is input from the external terminal OE of the oscillator 1 (the OE terminal of the temperature compensated oscillation circuit 2) within a predetermined period of time after a power supply voltage is started to be supplied to the external terminal VCC of the oscillator 1 (VCC terminal of the temperature compensated oscillation circuit 2) (that is, within a predetermined period of time after a power supply is turned on), the control unit 24 sets an operation mode of the oscillator 1 (temperature compensated oscillation circuit 2) to be an external communication mode after the predetermined period of time elapses. For example, the control unit 24 may set a period of time between when the resonator 3 starts to oscillate by the turn-on of the power supply of the oscillator 1 (temperature compensated oscillation circuit 2) and when it is detected that the oscillation is stabilized (for example, the clock signal OSCCLK has a desired amplitude) to be the predetermined period of time, and may determine that the predetermined period of time has elapsed when a counted number of pulses of the clock signal OSCCLK reaches a predetermined value. In addition, for example, the control unit 24 may measure the predetermined period of time on the basis of an output signal of an RC time constant circuit that starts to operate when the power supply of the oscillator 1 (temperature compensated oscillation circuit 2) is turned on.

In the external communication mode, a serial clock signal and a serial data signal are input in synchronization with each other as control signals from the external terminals OE and OUT of the oscillator 1 (OE and OUT terminals of the temperature compensated oscillation circuit 2), and the control unit 24 samples the serial data signal for each edge of the serial clock signal according to, for example, the standard of an I²C (Inter-Integrated Circuit) bus and performs processing such as the setting of operation modes and the setting of control data in each operation mode on the basis of the sampled command and data. For example, the control unit 24 samples a command for making the operation mode of the oscillator 1 (temperature compensated oscillation circuit 2) transition to a mode (the normal operation mode, the temperature correction table update mode, or the like) to thereby set the operation mode of the oscillator 1 (temperature compensated oscillation circuit 2) to the modes.

In a case where a control signal (output enable signal) which is input from the external terminal OE of the oscillator 1 (the OE terminal of the temperature compensated oscillation circuit 2) is in an active state (for example, a high level) in the normal operation mode, the control unit 24 performs control so as to operate the oscillation circuit 21 and output circuit 23. Thereby, an oscillation signal is output from the external terminal OUT of the oscillator 1 (the OUT terminal of the temperature compensated oscillation circuit 2).

In addition, in a case where a control signal (output enable signal) which is input from the external terminal OE of the oscillator 1 (the OE terminal of the temperature compensated oscillation circuit 2) is in a non-active state (for example, a low level) in the normal operation mode, the control unit 24 performs control so as to operate the oscillation circuit 21 and to stop the operation of the output circuit 23 when standby bit data stored in a non-volatile memory, not shown in the drawing, is in a non-active state (for example, zero), and performs control so as to stop the operation of the oscillation circuit 21 and the output circuit 23 when the standby bit data is in an active state (for example, 1). In any of these cases, the output of the oscillation signal from the external terminal OUT of the oscillator 1 (the OUT terminal of the temperature compensated oscillation circuit 2) is stopped.

Meanwhile, in a case where a control signal having a predetermined pattern is not input from the external terminal OE of the oscillator 1 (the OE terminal of the temperature compensated oscillation circuit 2) within a predetermined period of time after a power supply is turned on, the control unit 24 directly sets the operation mode of the oscillator 1 (temperature compensated oscillation circuit 2) to the normal operation mode without setting the operation mode to the external communication mode after the predetermined period of time elapses.

In addition, the control unit 24 performs control so as to operate the oscillation circuit 21, the output circuit 23, and the temperature correction table updating unit 27 in the temperature correction table update mode. Meanwhile, the control unit 24 performs control so as not to operate the temperature correction table updating unit 27 in the external communication mode and the normal operation mode.

The temperature measurement unit 25 is a circuit that measures temperature. In this embodiment, the temperature measurement unit 25 converts the measured temperature into a temperature measurement value DT which is a digital value, and outputs the converted value to the storage unit 26. For example, the temperature measurement unit 25 may be configured to include a temperature sensor (for example, a temperature sensor using temperature characteristics of a bandgap reference circuit, or the like) which has a voltage changing depending on temperature and an analog to digital (A/D) converter that converts an output signal of the temperature sensor into a temperature measurement value DT, or may be configured to include an oscillation unit having an oscillation frequency changing depending on temperature and a measurement unit that measures an oscillation frequency of the oscillation unit and outputs a temperature measurement value DT based on a measurement result.

Figure 6:
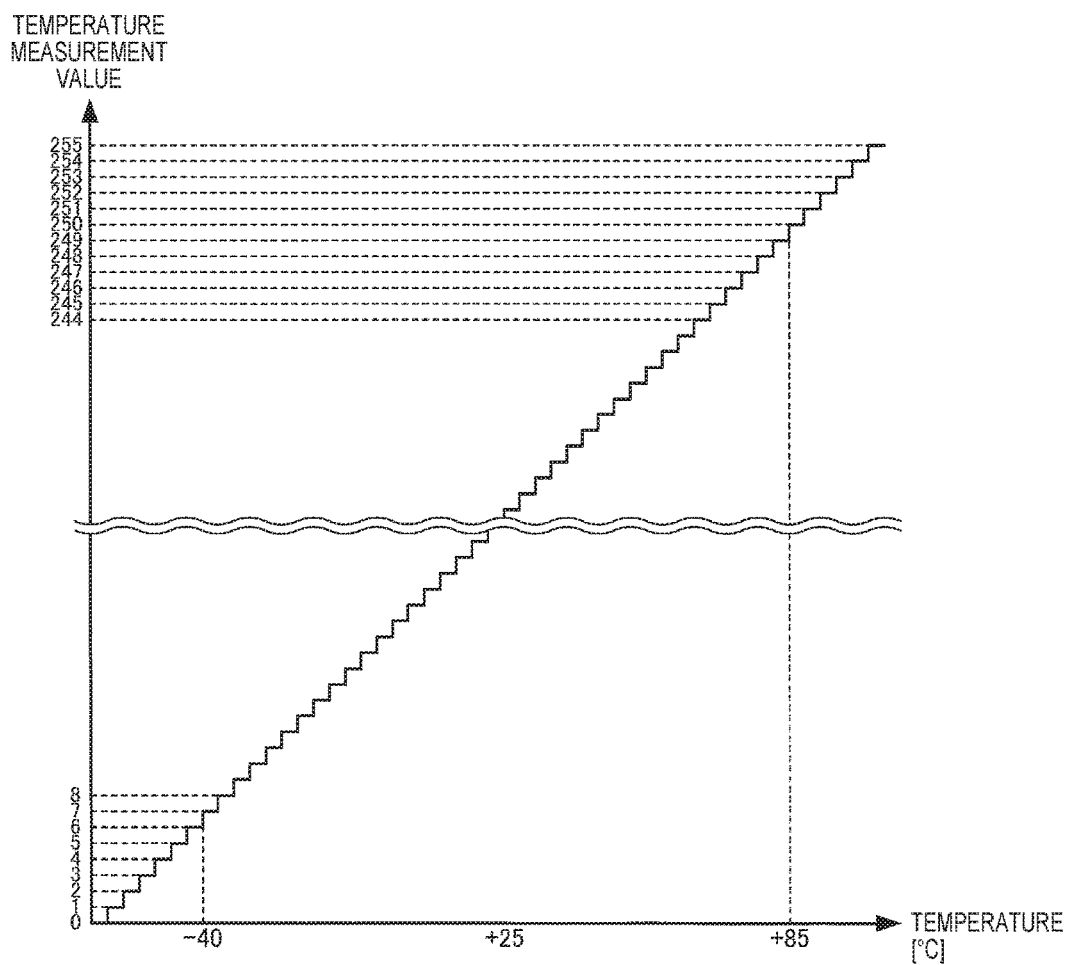
FIG. 6 is a diagram illustrating an example of temperature characteristics of an output signal of a temperature measurement unit.

FIG. 6 is a diagram illustrating an example of temperature characteristics of an output signal (temperature measurement value DT) of the temperature measurement unit 25. In FIG. 6, the horizontal axis represents temperature (unit: ° C.), and the vertical axis represents the temperature measurement value DT. In the example of FIG. 6, the temperature measurement value DT is a 8-bit digital value (0 to 255), and changes at a substantially fixed ratio in a stepwise manner with respect to a change in temperature in at least an operation guarantee temperature range (for example, −40° C. to +85° C.). That is, in the example of FIG. 6, the temperature measurement unit 25 outputs the 8-bit temperature measurement value DT having a fixed resolution.

Referring back to FIG. 4, the storage unit 26 stores the temperature correction table 261 for correcting frequency temperature characteristics of the oscillation signal (clock signal OSCCLK) which is output by the oscillation circuit 21. Specifically, the storage unit 26 includes a non-volatile memory, not shown in the drawing, and the temperature correction table 261 is stored in the non-volatile memory. Examples of the non-volatile memory to be applied may include an electrically erasable programmable read-only memory (EEPROM), a flash memory, and the like.

In this embodiment, the temperature correction table 261 is a table in which a correspondence relationship between the temperature measurement value DT which is output by the temperature measurement unit 25 and the frequency division ratio (an integer frequency division ratio N and a fraction frequency division ratio F/M) of the fractional N-PLL circuit 22 is described. The storage unit 26 selects the integer frequency division ratio N and the fraction frequency division ratio F/M which are described (stored) in association with the 8-bit temperature measurement value DT which is output by the temperature measurement unit 25 in the temperature correction table 261, and outputs the selected ratios to the fractional N-PLL circuit 22.

FIG. 7 is a diagram illustrating an example of a configuration of the temperature correction table 261. In the example of FIG. 7, a correspondence relationship between a 8-bit temperature measurement value DT (0 to 255) which is also used as addresses 0 to 255 of 8 bits, an integer frequency division ratio N (X0 to X255), and a fraction frequency division ratio F/M (Y0 to Y255) is described (stored). In the example of FIG. 7, in the temperature correction table 261, the integer frequency division ratio N and the fraction frequency division ratio F/M which are stored in the address are read out using the temperature measurement value DT which is output by the temperature measurement unit 25 as a read-out address. Thereby, an appropriate integer frequency division ratio N and fraction frequency division ratio F/M based on temperature are output to the fractional N-PLL circuit 22, and frequency temperature characteristics of the oscillation circuit 21 are corrected in the fractional N-PLL circuit 22.

Referring back to FIG. 4, the temperature correction table updating unit 27 performs a process of updating the temperature correction table 261 (temperature correction table updating process) on the basis of the output signal (clock signal PLLCLK) of the fractional N-PLL circuit 22 and a reference clock signal REFCLK which is input from the terminal of the temperature compensated oscillation circuit 2 in the temperature correction table update mode. Specifically, the temperature correction table updating unit 27 calculates a frequency division ratio for bringing the frequency of the output signal (clock signal PLLCLK) of the fractional N-PLL circuit 22 close to the frequency of the reference clock signal REFCLK in the temperature correction table update mode, and updates the temperature correction table 261 on the basis of the frequency division ratio and the temperature measurement value DT which is output by the temperature measurement unit 25. In this embodiment, in the temperature correction table update mode, the reference clock signal REFCLK having a sufficiently small frequency deviation with respect to a target frequency (sufficiently satisfying frequency accuracy required for the oscillator 1) is input from the external terminal OE of the oscillator 1 (the OE terminal of the temperature compensated oscillation circuit 2), and the ambient temperature of the oscillator 1 gradually changes in a temperature range (for example, −45° C. to +90° C.) including an operation guarantee temperature range (for example, −40° C. to +85° C.) of the oscillator 1, thereby causing the temperature correction table updating unit 27 to perform the temperature correction table updating process. Details of this temperature correction table updating process will be described later.

Configuration of Fractional N-PLL Circuit

Figure 8:
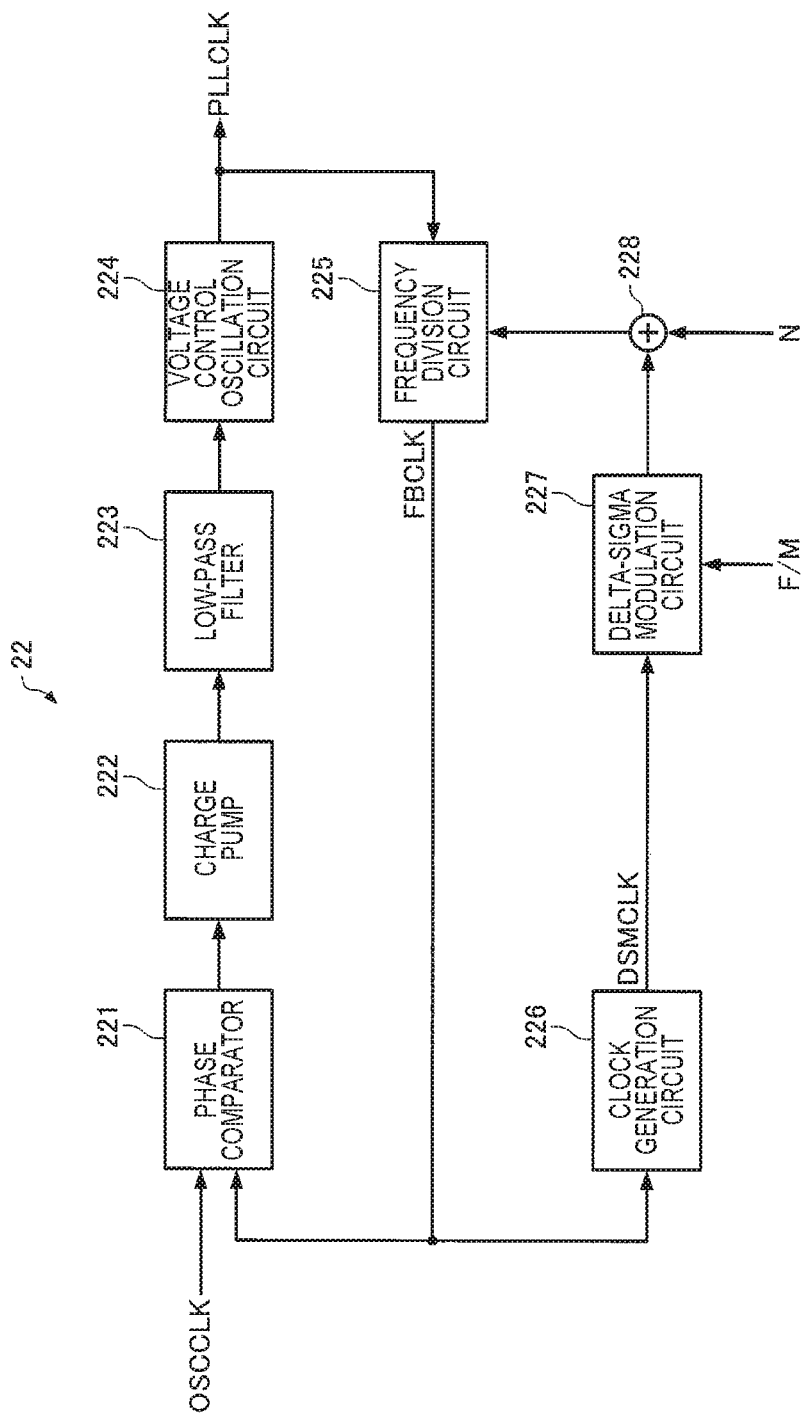
FIG. 8 is a diagram illustrating a configuration example of a fractional N-PLL circuit.

FIG. 8 is a diagram illustrating a configuration example of the fractional N-PLL circuit 22 according to this embodiment. As illustrated in FIG. 8, the fractional N-PLL circuit 22 is configured to include a phase comparator 221, a charge pump 222, a low-pass filter 223, a voltage control oscillation circuit 224, a frequency division circuit 225, a clock generation circuit 226, a delta-sigma modulation circuit 227, and an addition and subtraction circuit 228.

The phase comparator 221 compares a phase difference in the clock signal OSCCLK which is output by the oscillation circuit 21 with a phase difference in a clock signal FBCLK which is output by the frequency division circuit 225, and outputs a comparison result as a pulse voltage.

The charge pump 222 converts the pulse voltage which is output by the phase comparator 221 into a current, and the low-pass filter 223 smooths the current which is output by the charge pump 222 and converts the smoothed current into a voltage.

The voltage control oscillation circuit 224 outputs the clock signal PLLCLK having a frequency changing depending on a control voltage by using an output voltage of the low-pass filter 223 as the control voltage. The voltage control oscillation circuit 224 can be realized by any of various types of oscillation circuits such as an LC oscillation circuit constituted by an inductance element such as a coil and a capacitive element such as a capacitor, an oscillation circuit using a piezoelectric resonator such as a quartz crystal resonator, and the like.

The frequency division circuit 225 outputs the clock signal FBCLK obtained by dividing the frequency of the clock signal PLLCLK, which is output by the voltage control oscillation circuit 224, by an integer by using an output signal of the addition and subtraction circuit 228 as a frequency division ratio (integer frequency division ratio).

The clock generation circuit 226 generates a clock signal DSMCLK by using the clock signal FBCLK, and outputs the generated clock signal. For example, the clock generation circuit 226 may output the clock signal FBCLK as the clock signal DSMCLK as it is, and may output the clock signal DSMCLK obtained by dividing the frequency of the clock signal FBCLK by an integer.

The delta-sigma modulation circuit 227 performs delta-sigma modulation in which the fraction frequency division ratio F/M which is input from the temperature correction table 261 is integrated to be quantized, in synchronization with the clock signal DSMCLK which is output by the clock generation circuit 226.

The addition and subtraction circuit 228 adds and subtracts a delta-sigma modulation signal which is output by the delta-sigma modulation circuit 227 and the integer frequency division ratio N which is input from the temperature correction table 261 to and from each other. The output signal of the addition and subtraction circuit 228 is input to the frequency division circuit 225. Regarding the output signal of the addition and subtraction circuit 228, a plurality of integer frequency division ratios in a range near the integer frequency division ratio N change in time series, and the time average value thereof coincides with N+F/M. In a steady state in which the phase of the clock signal OSCCLK and the phase of the clock signal FBCLK are synchronized with each other, the frequency $f_{PLLCLK}$ of the clock signal PLLCLK and the frequency $f_{OSCCLK}$ of the clock signal OSCCLK satisfy the relation of Expression (1), and thus the frequency $f_{PLLCLK}$ of the clock signal PLLCLK approximates to the target frequency.

For example, in a case where the target frequency of the clock signal PLLCLK is 100 MHz, a time average value of an output signal of the addition and subtraction circuit 228, that is, a time average value of a frequency division ratio of the frequency division circuit 225 is required to be approximately 1.0001 when the frequency of the clock signal OSCCLK is 99.99 MHz at a certain temperature TA. Therefore, in the temperature correction table 261, the integer frequency division ratio N associated with the temperature TA is set to 1, and the fraction frequency division ratio F/M is set to approximately 0.0001.

Temperature Correction Table Updating Process

As described above, the temperature correction table 261 is stored in the non-volatile memory of the storage unit 26, but an initial value of each bit of the non-volatile memory is not fixed. Therefore, in a step of manufacturing the oscillator 1, it is necessary to write the integer frequency division ratio N and the fraction frequency division ratio F/M enabling frequency temperature characteristics of the clock signal OSCCLK to be corrected in the address of the storage unit 26 storing the temperature correction table 261. In this embodiment, when the control unit 24 sets the operation mode of the oscillator 1 (temperature compensated oscillation circuit 2) to be the temperature correction table update mode, the temperature correction table updating unit 27 performs a temperature correction table updating process of updating the integer frequency division ratio N and the fraction frequency division ratio F/M which are stored in the temperature correction table.

Figure 9:
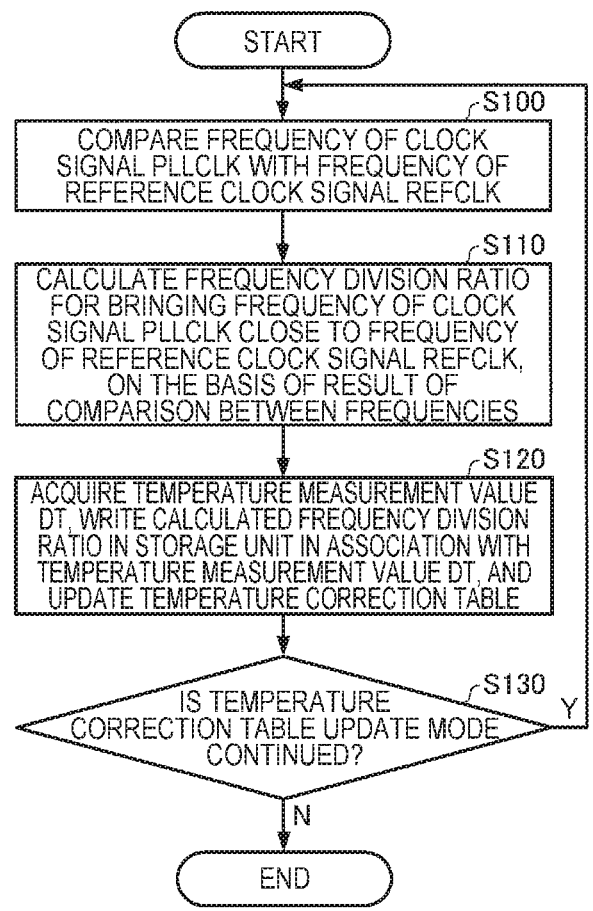
FIG. 9 is a flow chart illustrating an example of a procedure of a temperature correction table updating process according to the first embodiment.

FIG. 9 is a flow chart illustrating an example of a procedure of the temperature correction table updating process performed by the temperature correction table updating unit 27.

As illustrated in FIG. 9, when the operation mode of the oscillator 1 (temperature compensated oscillation circuit 2) is set to be the temperature correction table update mode, the temperature correction table updating unit 27 first compares the frequency $f_{PLLCLK}$ of the clock signal PLLCLK with a frequency $f_{REFCLK}$ of the reference clock signal REFCLK (S100). For example, the temperature correction table updating unit 27 may compare the frequencies with each other by counting the number of pulses of the reference clock signal REFCLK which is included in a period of time (frequency comparison period) in which a predetermined number of pulses of the clock signal PLLCLK is generated, or may compare the frequencies with each other by counting the number of pulses of the clock signal PLLCLK which is included in a period of time (frequency comparison period) in which a predetermined number of pulses of the reference clock signal REFCLK is generated.

Next, the temperature correction table updating unit 27 calculates a frequency division ratio (an integer frequency division ratio N and a fraction frequency division ratio F/M) for bringing the frequency $f_{PLLCLK}$ of the clock signal PLLCLK close to the frequency $f_{REFCLK}$ of the reference clock signal REFCLK, on the basis of a result of the comparison between the frequencies which is performed in Step S100 (S110).

Next, the temperature correction table updating unit 27 acquires the temperature measurement value DT which is output by the temperature measurement unit 25, writes the frequency division ratio (the integer frequency division ratio N and the fraction frequency division ratio F/M) which is calculated in Step S110 in the storage unit 26 in association with the temperature measurement value DT, and updates the temperature correction table 261 (S120).

The temperature correction table updating unit 27 continuously performs the processes of steps 100 to S120 while the temperature correction table update mode is continued (Y of S130), and terminates the processes when the temperature correction table update mode is terminated (N of S130).

Meanwhile, in the flow chart of FIG. 9, a portion of the processes of Steps S100 to S130 may be appropriately omitted or changed, or other processes may be added. In addition, in the flowchart of FIG. 9, the order of the processes of Steps S100 to S130 may be changed in a possible range.

Figure 10:
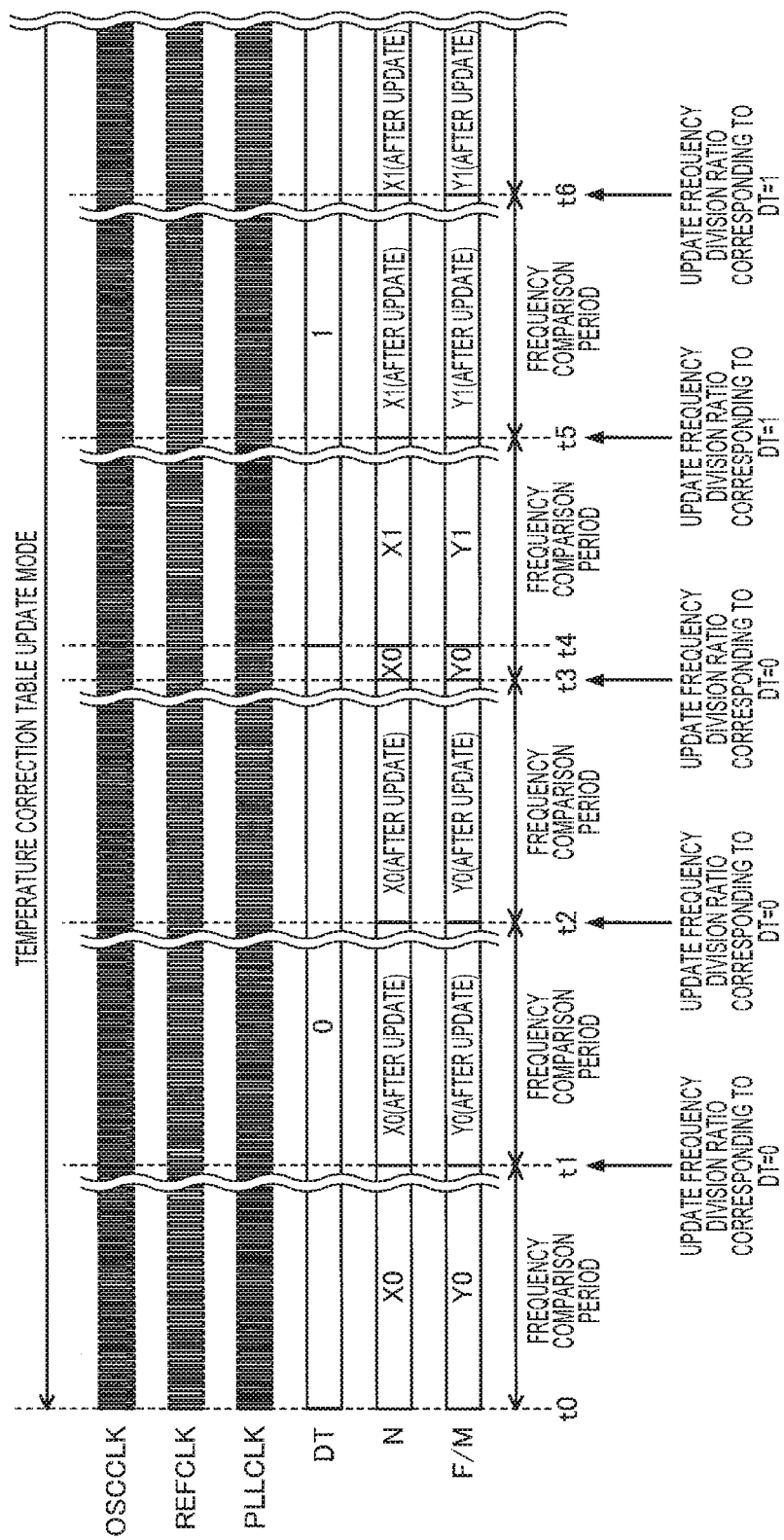
FIG. 10 is a diagram illustrating an example of signal waveforms in the temperature correction table updating process.

FIG. 10 is a diagram illustrating an example of signal waveforms in a case where the temperature correction table updating unit 27 performs the temperature correction table updating process according to the procedure illustrated in FIG. 9. In the example of FIG. 10, the temperature correction table 261 is configured as illustrated in FIG. 7, and it is assumed that all values X0 to X255 of the integer frequency division ratio N are initialized to 1 and all values Y0 to Y255 of the fraction frequency division ratio F/M are initialized to zero when the temperature correction table update mode is started.

In the example of FIG. 10, the ambient temperature of the oscillator 1 is, for example, approximately −45° and the temperature measurement value DT is set to zero at time t0 when the temperature correction table update mode is started. Therefore, the value of the integer frequency division ratio N which is output to the fractional N-PLL circuit 22 from the temperature correction table 261 of the storage unit 26 is set to X0 (=1), and the value of the fraction frequency division ratio F/M is set to Y0 (=0). For this reason, the frequency $f_{PLLCLK}$ of the clock signal PLLCLK coincides with the frequency $f_{OSCCLK}$ of the clock signal OSCCLK which is output by the oscillation circuit 21 and has a great frequency deviation caused by temperature characteristics of the resonator 3.

At time t1 after the frequency comparison period (period of time of the process of Step S100 of FIG. 9) elapses, the temperature measurement value DT remains being set to zero, and thus the value X0 of the integer frequency division ratio N and the value Y0 of the fraction frequency division ratio F/M which correspond to the temperature measurement value DT=0 of the temperature correction table 261 are updated (overwritten) on the basis of the value of the integer frequency division ratio N and the value of the fraction frequency division ratio F/M which are calculated by the temperature correction table updating unit 27. Thereby, the integer frequency division ratio N and the fraction frequency division ratio F/M which are output to the fractional N-PLL circuit 22 from the temperature correction table 261 are also updated, and the frequency $f_{PLLCLK}$ of the clock signal PLLCLK approximates to the frequency $f_{REFCLK}$ of the reference clock signal REFCLK.

Further, at time t2 after the frequency comparison period elapses, the temperature measurement value DT remains being set to zero, and thus the value X0 of the integer frequency division ratio N and the value Y0 of the fraction frequency division ratio F/M which correspond to the temperature measurement value DT=0 of the temperature correction table 261 are further updated (overwritten) on the basis of the value of the integer frequency division ratio N and the value of the fraction frequency division ratio F/M which are calculated by the temperature correction table updating unit 27. Thereby, the integer frequency division ratio N and the fraction frequency division ratio F/M which are output to the fractional N-PLL circuit 22 from the temperature correction table 261 are also updated, and the frequency $f_{PLLCLK}$ of the clock signal PLLCLK further approximates to the frequency $f_{REFCLK}$ of the reference clock signal REFCLK.

Further, at time t3 after the frequency comparison period elapses, the temperature measurement value DT remains being set to zero, and thus the value X0 of the integer frequency division ratio N and the value Y0 of the fraction frequency division ratio F/M which correspond to the temperature measurement value DT=0 of the temperature correction table 261 are further updated (overwritten) on the basis of the value of the integer frequency division ratio N and the value of the fraction frequency division ratio F/M which are calculated by the temperature correction table updating unit 27. Thereby, the integer frequency division ratio N and the fraction frequency division ratio F/M which are output to the fractional N-PLL circuit 22 from the temperature correction table 261 are also updated, and the frequency $f_{PLLCLK}$ of the clock signal PLLCLK further approximates to the frequency $f_{REFCLK}$ of the reference clock signal REFCLK.

Thereafter, at time t4, the temperature measurement value DT changes from 0 to 1 due to a rise in the ambient temperature of the oscillator 1, and the value of the integer frequency division ratio N and the value of the fraction frequency division ratio F/M which are output to the fractional N-PLL circuit 22 from the temperature correction table 261 of the storage unit 26 change to X1 (=1) and Y1 (=0), respectively. For this reason, the frequency $f_{PLLCLK}$ of the clock signal PLLCLK coincides with the frequency $f_{OSCCLK}$ of the clock signal OSCCLK which is output by the oscillation circuit 21 and has a great frequency deviation caused by temperature characteristics of the resonator 3.

Next, at time t5 after the frequency comparison period elapses, the temperature measurement value DT is 1, and thus the value X1 of the integer frequency division ratio N and the value Y1 of the fraction frequency division ratio F/M which correspond to the temperature measurement value DT=1 of the temperature correction table 261 are updated (overwritten) on the basis of the value of the integer frequency division ratio N and the value of the fraction frequency division ratio F/M which are calculated by the temperature correction table updating unit 27. Thereby, the integer frequency division ratio N and the fraction frequency division ratio F/M which are output to the fractional N-PLL circuit 22 from the temperature correction table 261 are also updated, and the frequency $f_{PLLCLK}$ of the clock signal PLLCLK approximates to the frequency $f_{REFCLK}$ of the reference clock signal REFCLK.

Further, at time t6 after the frequency comparison period elapses, the temperature measurement value DT remains being set to 1, and thus the value X1 of the integer frequency division ratio N and the value Y1 of the fraction frequency division ratio F/M which correspond to the temperature measurement value DT=1 of the temperature correction table 261 are further updated (overwritten) on the basis of the value of the integer frequency division ratio N and the value of the fraction frequency division ratio F/M which are calculated by the temperature correction table updating unit 27. Thereby, the integer frequency division ratio N and the fraction frequency division ratio F/M which are output to the fractional N-PLL circuit 22 from the temperature correction table 261 are also updated, and the frequency $f_{PLLCLK}$ of the clock signal PLLCLK further approximates to the frequency $f_{REFCLK}$ of the reference clock signal REFCLK.

Hereinafter, similarly, when the temperature measurement value DT is k while the temperature correction table update mode is continued, a value Xk of the integer frequency division ratio N and a value Yk of the fraction frequency division ratio F/M of the temperature correction table 261 are sequentially updated.

Method of Manufacturing Oscillator

Figure 11:
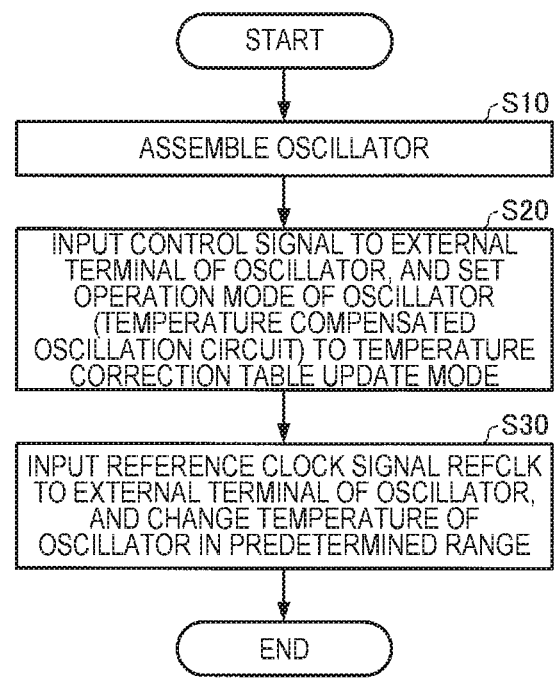
FIG. 11 is a flow chart illustrating an example of a method of manufacturing the oscillator according to this embodiment.
Figure 12:
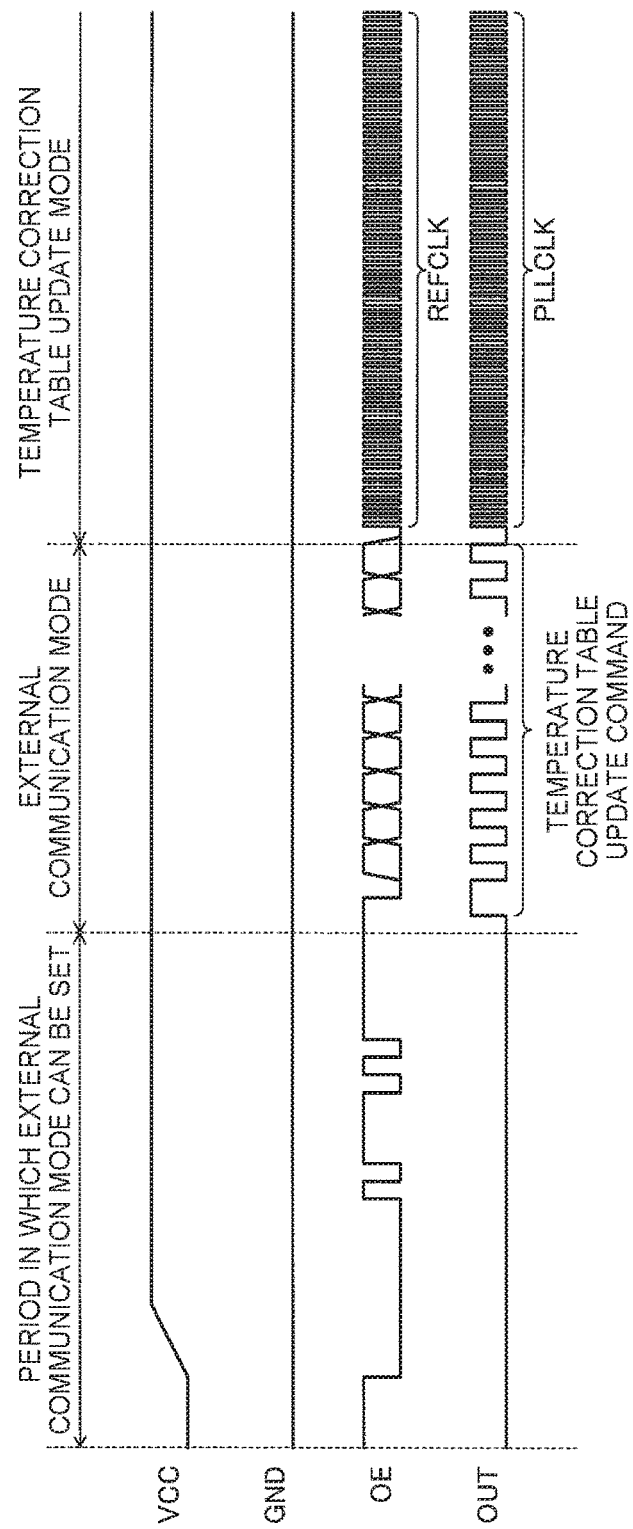
FIG. 12 is a diagram illustrating an example of signal waveforms of external terminals of the oscillator.

FIG. 11 is a flow chart illustrating an example of a method of manufacturing an oscillator according to this embodiment. The method of manufacturing an oscillator according to this embodiment includes steps S10 to S30 illustrated in FIG. 11. However, in the method of manufacturing an oscillator according to this embodiment, a portion of steps S10 to S30 may be omitted or changed, or other steps may be added. In addition, FIG. 12 is a diagram illustrating an example of signal waveforms of the external terminals VCC, GND, OE, and OUT of the oscillator 1 in steps S10 and S20 of the flow chart of FIG. 11.

As illustrated in FIG. 11, in this embodiment, first, the oscillator 1 including the resonator 3 and the temperature compensated oscillation circuit 2 is assembled (step S10).

Next, a control signal is input to the external terminal of the oscillator 1, and the operation mode of the oscillator 1 (temperature compensated oscillation circuit 2) is set to be a temperature correction table update mode (step S20). That is, as illustrated in FIG. 12, a signal having a predetermined pattern determined in advance is input to the external terminal OE of the oscillator 1 to set the operation mode of the oscillator 1 (temperature compensated oscillation circuit 2) to be an external communication mode within a predetermined period of time after a power supply is turned on, and a serial clock signal and a serial data signal (temperature correction table update command) are respectively input from the external terminals OE and OUT in the external communication mode to set the operation mode of the oscillator 1 (temperature compensated oscillation circuit 2) to be a temperature correction table update mode.

Next, the reference clock signal REFCLK is input to the external terminal OE of the oscillator 1 (the OE terminal of the temperature compensated oscillation circuit 2) to change the temperature of the oscillator 1 in a predetermined range (step S30). That is, as illustrated in FIG. 12, the ambient temperature of the oscillator 1 is gradually changed from a lower limit to an upper limit (or from the upper limit to the lower limit) of a temperature range (for example, −45° C. to +90° C.) including an operation guarantee temperature range (for example, −40° C. to +85° C.) of the oscillator 1 in a state where the reference clock signal REFCLK is input to the external terminal OE of the oscillator 1. Thereby, the temperature correction table 261 enabling frequency temperature characteristics of the clock signal OSCCLK to be corrected in the operation guarantee temperature range (for example, −40° C. to +85° C.) of the oscillator 1 is created. At this time, it is not necessary to stabilize the ambient temperature of the oscillator 1 for each predetermined temperature. However, when the speed of the change in the ambient temperature of the oscillator 1 is excessively high, a frequency division ratio of a portion of the temperature correction table 261 is not set to an appropriate value, and thus there is a possibility that sufficient frequency accuracy is not obtained. Therefore, it is preferable to change the ambient temperature of the oscillator 1 in a sufficiently gradual manner. For example, time required for the calculation of a value of an appropriate frequency division ratio with respect to each of 8-bit temperature measurement values DT (0 to 255) is less than one second, and thus the temperature may be changed for approximately several minutes while maintaining a constant speed from −40° C. to +85° C.

Meanwhile, in the flow chart of FIG. 11, a plurality of oscillators 1 may be assembled in step S10, the operation modes of the plurality of oscillators 1 may be set to be a temperature correction table update mode in step S20, and step S30 may be simultaneously performed on the plurality of oscillators 1. In this manner, the plurality of oscillators 1 can simultaneously create an appropriate temperature correction table 261, and thus it is possible to reduce a total number of manufacturing steps and to reduce a manufacturing cost of the oscillator 1 as the number of oscillators 1 increases. Alternatively, there is a small increase in the number of manufacturing steps for each oscillator 1 in spite of an increase in a total number of manufacturing steps by changing the ambient temperature of the plurality of oscillators 1 in a more gradual manner, and thus it is possible to improve the frequency accuracy of the oscillator 1 while suppressing an increase in cost.

Operational Effects

As described above, according to the oscillator 1 of the first embodiment, in the temperature compensated oscillation circuit 2, a frequency division ratio of the fractional N-PLL circuit 22 for correcting frequency temperature characteristics of the clock signal OSCCLK is set in association with the temperature measurement value DT which is output by the temperature measurement unit 25, and thus it is possible to realize the oscillator having a small frequency deviation depending on temperature when a correspondence relationship between the actual temperature and the temperature measurement value DT does not fluctuate in spite of low accuracy of measurement of the temperature measurement unit 25. In addition, according to the first embodiment, since a waiting time for accurately stabilizing the ambient temperature of the oscillator 1 at a plurality of desired temperatures is not necessary in order to create the temperature correction table 261, the number of manufacturing steps is decreased, and thus it is possible to reduce a manufacturing cost of the oscillator 1.

In particular, the oscillator 1 of the first embodiment is set to be in a temperature correction table update mode to thereby automatically update (create) the temperature correction table 261 on the basis of the reference clock signal REFCLK which is input from the external terminal OE, and thus an inspection apparatus does not need to perform a process of creating the temperature correction table 261, which allowing the plurality of oscillators 1 to be simultaneously manufactured. Therefore, it is not necessary to provide a large-scale manufacturing apparatus for individually adjusting the oscillators 1 and not necessary to adjust variations in characteristics of the temperature measurement unit 25 of the oscillator 1, and thus it is possible to reduce a manufacturing cost of the oscillator 1.

1-2. Second Embodiment

Figure 13:
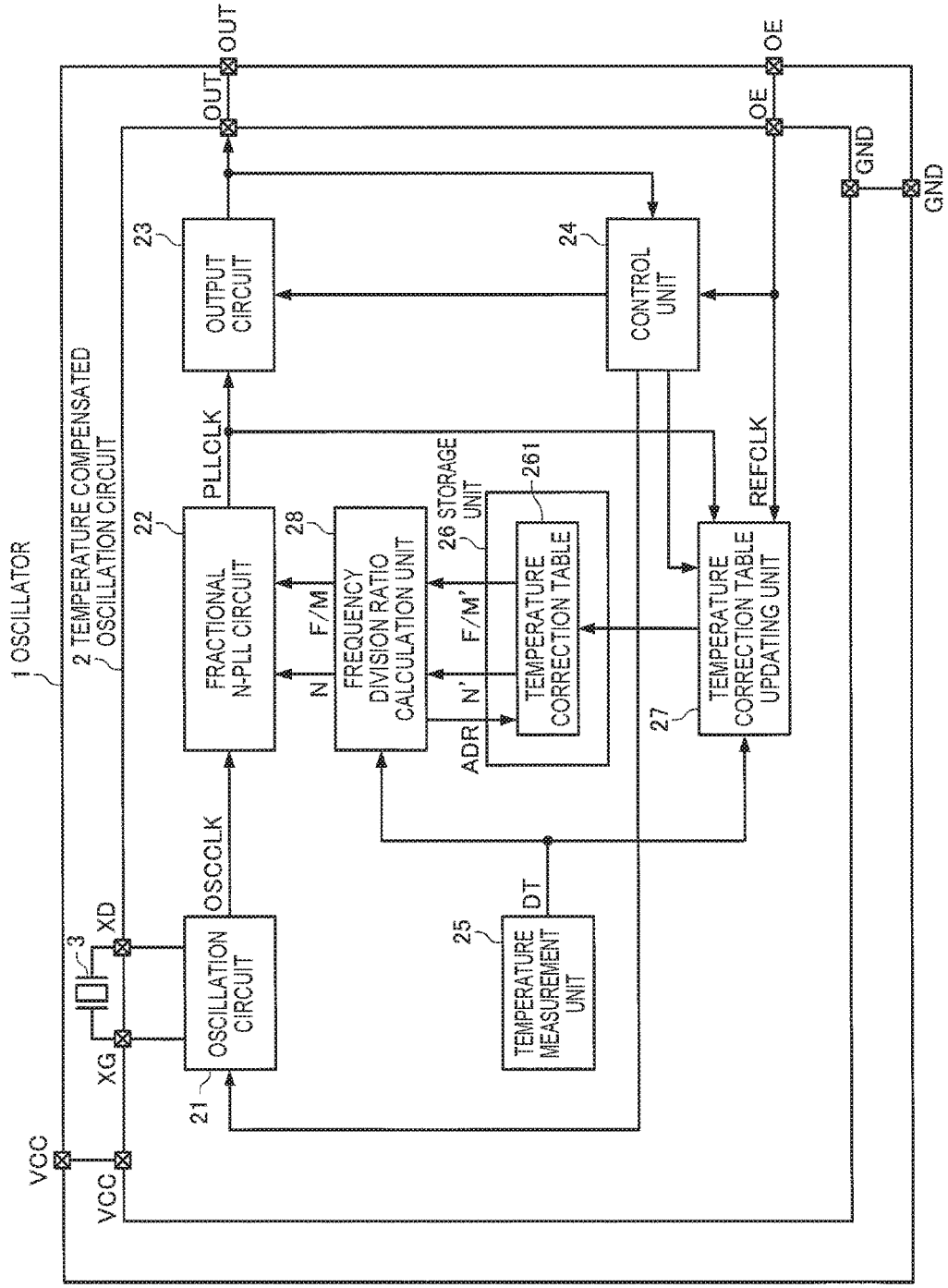
FIG. 13 is a functional block diagram of an oscillator according to a second embodiment.

Hereinafter, regarding an oscillator 1 according to a second embodiment, the same description as in the first embodiment will be omitted or simplified, and only contents different from those in the first embodiment will be mainly described. The structure of the oscillator 1 according to the second embodiment is the same as that of the oscillator 1 (FIGS. 1 to 3) according to the first embodiment, and thus the illustration and description thereof will not be repeated. FIG. 13 is a functional block diagram of the oscillator 1 according to the second embodiment. In FIG. 13, the same components as those in FIG. 4 will be denoted by the same reference numerals and signs.

As illustrated in FIG. 13, in the oscillator 1 according to the second embodiment, a temperature compensated oscillation circuit 2 is configured to further include a frequency division ratio calculation unit 28 in addition to the same components as those in the first embodiment (FIG. 5).

In a case where a frequency division ratio corresponding to a measurement value (temperature measurement value DT) obtained by a temperature measurement unit 25 is described in a temperature correction table 261, the frequency division ratio calculation unit 28 outputs the frequency division ratio to a fractional N-PLL circuit 22. Specifically, the frequency division ratio calculation unit 28 calculates an address ADR of a storage unit 26 storing a frequency division ratio corresponding to the temperature measurement value DT on the basis of the temperature measurement value DT, reads out the value of the frequency division ratio in accordance with the calculated address ADR, and outputs the read-out value to the fractional N-PLL circuit 22.

In addition, in a case where a frequency division ratio corresponding to the temperature measurement value DT is not described in the temperature correction table 261, the frequency division ratio calculation unit 28 calculates (approximate calculation) the frequency division ratio corresponding to the temperature measurement value DT by using a plurality of frequency division ratios described in the temperature correction table 261, and outputs the calculated frequency division ratio to the fractional N-PLL circuit 22. For example, in a case where a frequency division ratio corresponding to the temperature measurement value DT is not described in the temperature correction table 261, the frequency division ratio calculation unit 28 may perform approximate calculation (complementary calculation) of the frequency division ratio corresponding to the temperature measurement value DT by using a frequency division ratio corresponding to a temperature measurement value smaller than the temperature measurement value DT and a frequency division ratio corresponding to a temperature measurement value larger than the temperature measurement value DT which are described in the temperature correction table 261. Specifically, the frequency division ratio calculation unit 28 calculates a plurality of addresses ADR of the storage unit 26 storing a plurality of frequency division ratios necessary for the approximate calculation of the frequency division ratio corresponding to the temperature measurement value DT on the basis of the temperature measurement value DT, sequentially reads out and acquires the values of the plurality of frequency division ratios stored in the calculated plurality of addresses ADR, performs approximate calculation of the frequency division ratio corresponding to the temperature measurement value DT by using the values of the plurality of frequency division ratios, and outputs the calculated frequency division ratio to the fractional N-PLL circuit 22.

FIG. 14 is a diagram illustrating an example of the temperature correction table 261 according to the second embodiment. In the example of FIG. 14, a correspondence relationship between a temperature measurement value DT (0, 4, 8, . . . , 244, 248, and 252) of which low-order 2 bits in a 8-bit temperature measurement value DT (0 to 255) are all 0, an integer frequency division ratio N' (X0, X4, X8, . . . , X244, X248, and X252), and a fraction frequency division ratio F/M' (Y0, Y4, Y8, . . . , Y244, Y248, and Y252) is described (stored). In short, the temperature correction table 261 of FIG. 14 is configured such that a correspondence relationship between the temperature measurement value DT and the frequency division ratio is selected every fourth values and the remaining values are thinned out, with respect to the temperature correction table 261 of FIG. 7, and the address ADR (0 to 63) coincides with a value of high-order 6 bits in the 8-bit temperature measurement value DT (0 to 255).

In this case, when low-order 2 bits of the 8-bit temperature measurement value DT are all 0, the frequency division ratio (the integer frequency division ratio N' and the fraction frequency division ratio F/M') which corresponds to the temperature measurement value DT is described in the temperature correction table 261, and thus the frequency division ratio calculation unit 28 reads out the value of the integer frequency division ratio N' and the value of the fraction frequency division ratio F/M' from the storage unit 26 (temperature correction table 261) by using a value of high-order 6 bits in the temperature measurement value DT as the address ADR, and outputs the read-out values to the fractional N-PLL circuit 22 as an integer frequency division ratio N and a fraction frequency division ratio F/M. For example, when the temperature measurement value DT is 0, the frequency division ratio calculation unit 28 reads out the value X0 of the integer frequency division ratio N' and the value Y0 of the fraction frequency division ratio F/M' from the storage unit 26 (temperature correction table 261), and outputs the read-out values to the fractional N-PLL circuit 22 as an integer frequency division ratio N and a fraction frequency division ratio F/M.

In addition, when either or both of the low-order 2 bits of the 8-bit temperature measurement value DT are 1, since the frequency division ratio (the integer frequency division ratio N' and the fraction frequency division ratio F/M') which corresponds to the temperature measurement value DT is not described in the temperature correction table 261, the frequency division ratio calculation unit 28 first reads out, for example, the value of the integer frequency division ratio N' and the value of the fraction frequency division ratio F/M' from the storage unit 26 (temperature correction table 261) by using a value of high-order 6 bits of the temperature measurement value DT as the address ADR. Further, the frequency division ratio calculation unit 28 repeatedly performs a process of reading out the value of the integer frequency division ratio N' and the value of the fraction frequency division ratio F/M', for example, by increasing (decreasing) the values of the address ADR by a predetermined number, to thereby acquire a predetermined number of values of the integer frequency division ratio N' and the fraction frequency division ratio F/M'. The frequency division ratio calculation unit 28 performs approximate calculation of the values of the integer frequency division ratio N and the fraction frequency division ratio F/M corresponding to the temperature measurement value DT by using the acquired predetermined number of values of the integer frequency division ratio N' and the fraction frequency division ratio F/M', and outputs the calculated values to the fractional N-PLL circuit 22. For example, in a case where frequency temperature characteristics of the clock signal OSCCLK are shown as a cubic curve (see FIG. 5), the frequency division ratio calculation unit 28 reads out values X0, X4, and X8 of the integer frequency division ratio N' and values Y0, Y4, and Y8 of the fraction frequency division ratio F/M' from the addresses 0, 1, and 2 of the storage unit 26 (temperature correction table 261) when the temperature measurement value DT is 3, specifies a cubic function in which a frequency division ratio=X0+Y0 is established when the temperature measurement value DT=0, a frequency division ratio=X4+Y4 is established when the temperature measurement value DT=4, a frequency division ratio=X8+Y8 is established when the temperature measurement value DT=8, performs approximate calculation (complementary calculation) of the corresponding frequency division ratio (the integer frequency division ratio N and the fraction frequency division ratio F/M) by the substitution of the temperature measurement value DT=3 for the cubic function, and outputs the calculated value to the fractional N-PLL circuit 22.

Meanwhile, in a case where the frequency division ratio corresponding to the temperature measurement value DT is not described in the temperature correction table 261, the frequency division ratio calculation unit 28 may appropriately determine the predetermined number of values of the integer frequency division ratio N' and the fraction frequency division ratio F/M' which are acquired from the storage unit 26 (temperature correction table 261) or the predetermined number of values of the address ADR which is increased (or decreased) in accordance with the frequency temperature characteristics of the clock signal OSCCLK so that the values of the integer frequency division ratio N and the fraction frequency division ratio F/M which are obtained by the approximate calculation satisfy a sufficient level of accuracy.

A temperature correction table updating unit 27 performs a process of updating the temperature correction table 261 (temperature correction table updating process) on the basis of an output signal (clock signal PLLCLK) of the fractional N-PLL circuit 22 and a reference clock signal REFCLK which is input from the outside of the temperature compensated oscillation circuit 2 in a temperature correction table update mode. Specifically, the temperature correction table updating unit 27 calculates a frequency division ratio for bringing the frequency of the output signal (clock signal PLLCLK) of the fractional N-PLL circuit 22 close to the frequency of the reference clock signal REFCLK only in a case where a frequency division ratio corresponding to the temperature measurement value DT which is output by the temperature measurement unit 25 is described in the temperature correction table 261 in the temperature correction table update mode, and updates the temperature correction table 261 on the basis of the frequency division ratio and the temperature measurement value DT which is output by the temperature measurement unit 25. Similarly to the first embodiment, also in the second embodiment, the reference clock signal REFCLK having a sufficiently small frequency deviation with respect to a target frequency (sufficiently satisfying frequency accuracy required for the oscillator 1) is input from an external terminal OE of the oscillator 1 (an OE terminal of the temperature compensated oscillation circuit 2) in the temperature correction table update mode, and the ambient temperature of the oscillator 1 gradually changes in a temperature range (for example, −45° C. to +90° C.) including an operation guarantee temperature range (for example, −40° C. to +85° C.) of the oscillator 1, thereby causing the temperature correction table updating unit 27 to perform the temperature correction table updating process.

Figure 15:
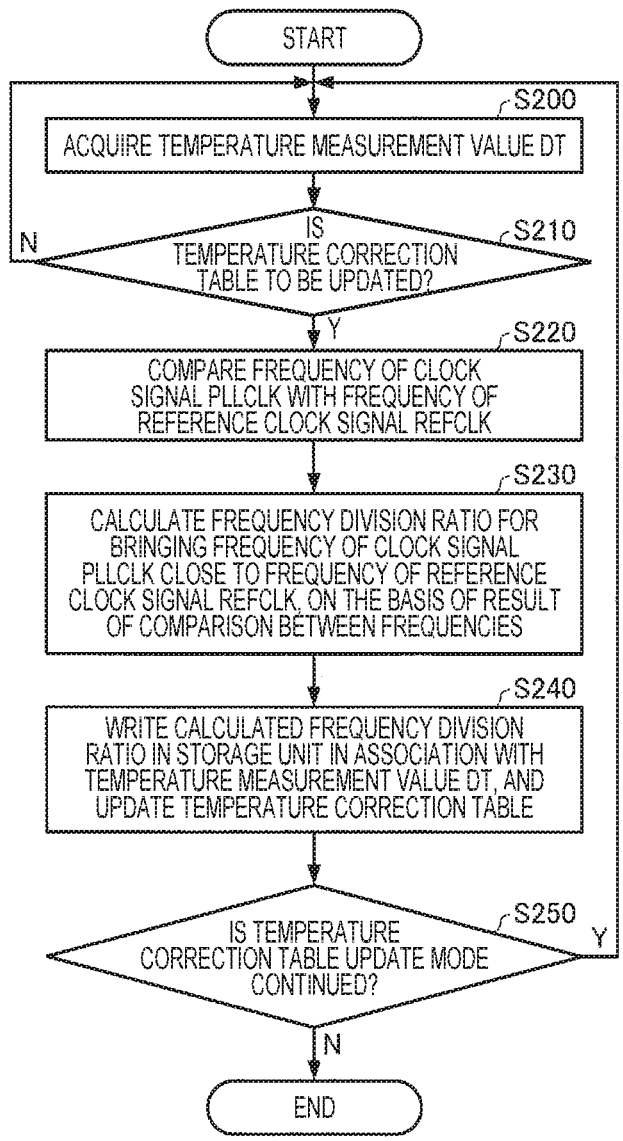
FIG. 15 is a flow chart illustrating an example of a procedure of a temperature correction table updating process according to the second embodiment.

FIG. 15 is a flow chart illustrating an example of a procedure of a temperature correction table updating process performed by the temperature correction table updating unit 27 according to the second embodiment.

As illustrated in FIG. 15, when an operation mode of the oscillator 1 (temperature compensated oscillation circuit 2) is set to be a temperature correction table update mode, the temperature correction table updating unit 27 first acquires the temperature measurement value DT which is output by the temperature measurement unit 25 (S200).

Next, the temperature correction table updating unit 27 determines that the temperature correction table 261 is to be updated when a frequency division ratio corresponding to the temperature measurement value DT acquired in Step S200 is described in the temperature correction table, and determines that the temperature correction table is not to be updated when a frequency division ratio corresponding to the temperature measurement value DT acquired in Step S200 is not described (S210). For example, in a case where the temperature correction table 261 is configured as illustrated in FIG. 14, the temperature correction table updating unit 27 determines that the temperature correction table is to be updated when the temperature measurement value DT acquired in Step S200 is any one of 0, 4, 8, . . . , 244, 248, and 252, and determines that the temperature correction table is not to be updated when the temperature measurement value DT is a value other than the values.

In a case where the temperature correction table updating unit 27 determines that the temperature correction table is not to be updated (N of S210), the temperature correction table updating unit performs the process of step S200 again. In addition, in a case where the temperature correction table updating unit 27 determines that the temperature correction table is to be updated (Y of S210), the temperature correction table updating unit compares a frequency $f_{PLLCLK}$ of the clock signal PLLCLK with a frequency $f_{REFCLK}$ of the reference clock signal REFCLK (S220).

Next, the temperature correction table updating unit 27 calculates a frequency division ratio (an integer frequency division ratio N' and a fraction frequency division ratio F/M') for bringing the frequency $f_{PLLCLK}$ of the clock signal PLLCLK close to the frequency $f_{REFCLK}$ of the reference clock signal REFCLK, on the basis of a result of the comparison between the frequencies which is performed in Step S220 (S230).

Next, the temperature correction table updating unit 27 writes the frequency division ratio (the integer frequency division ratio N' and the fraction frequency division ratio F/M'), which is calculated in Step S230, in the storage unit 26 in association with the temperature measurement value DT acquired in Step S200 to thereby update the temperature correction table 261 (S240).

The temperature correction table updating unit 27 continuously performs the processes of Steps S200 to S240 while the temperature correction table update mode is continued (Y of S250), and terminates the processes when the temperature correction table update mode is terminated (N of S250).

Meanwhile, in the flow chart of FIG. 15, a portion of the processes of Steps S200 to S250 may be appropriately omitted or changed, or other processes may be added. In addition, in the flow chart of FIG. 15, the order of the processes of Steps S200 to S250 may be changed in a possible range.

A method of manufacturing an oscillator of the second embodiment may be the same as that of the first embodiment (FIG. 11), and thus the illustration and description of the flowchart will not be repeated.

The above-described oscillator 1 according to the second embodiment exhibits the same operational effects as those of the oscillator 1 according to the first embodiment. Further, in the oscillator 1 according to the second embodiment, approximate calculation of a frequency division ratio corresponding to a temperature measurement value DT, which is not described in the temperature correction table 261, is performed in the temperature compensated oscillation circuit 2, and thus it is possible to reduce the size of the temperature correction table 261. Therefore, according to the second embodiment, it is possible to further reduce a manufacturing cost of the oscillator.

1-3. Modification Example

For example, the oscillator 1 according to the first embodiment or the second embodiment is an oscillator having a temperature compensation function (TCXO and the like), but may be an oscillator having a frequency control function together with a temperature compensation function (voltage controlled temperature compensated crystal oscillator (VC-TCXO) and the like), or the like.

2. Electronic Apparatus

Figure 16:
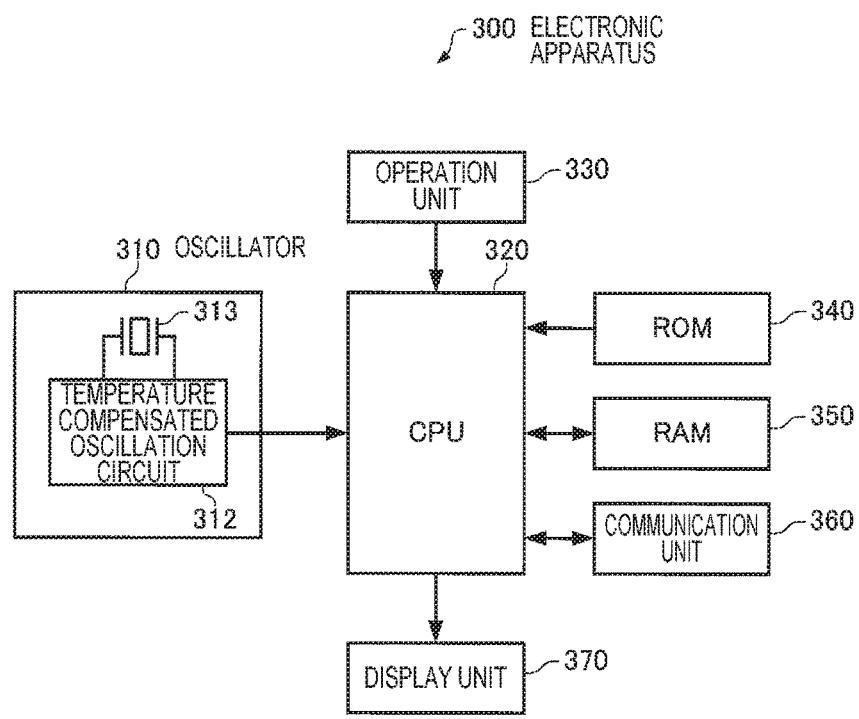
FIG. 16 is a functional block diagram of an electronic apparatus according to this embodiment.
Figure 17:
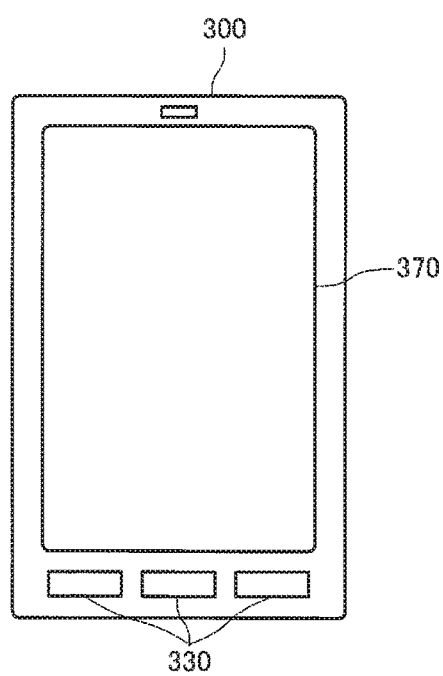
FIG. 17 is a diagram illustrating an example of the exterior of an electronic apparatus according to this embodiment.

FIG. 16 is a functional block diagram illustrating an example of a configuration of an electronic apparatus according to this embodiment. In addition, FIG. 17 is a diagram illustrating an example of the exterior of a smartphone which is an example of an electronic apparatus according to this embodiment.

An electronic apparatus 300 according to this embodiment is configured to include an oscillator 310, a central processing unit (CPU) 320, an operation unit 330, a read only memory (ROM) 340, a random access memory (RAM) 350, a communication unit 360, and a display unit 370. Meanwhile, the electronic apparatus according to this embodiment may be configured such that a portion of components (respective units) of FIG. 16 is omitted or changed or other components are added.

The oscillator 310 includes a temperature compensated oscillation circuit 312 and a resonator 313. The temperature compensated oscillation circuit 312 oscillates the resonator 313 to generate an oscillation signal. The oscillation signal is output to the CPU 320 from an external terminal of the oscillator 310.

The CPU 320 is a processing unit that performs various calculation processes or a control process by using the oscillation signal which is input from the oscillator 310 as a clock signal, in accordance with programs stored in the ROM 340 and the like. Specifically, the CPU 320 performs various processes based on an operation signal received from the operation unit 330, a process of controlling the communication unit 360 in order to perform data communication with an external device, a process of transmitting a display signal for displaying various pieces of information on the display unit 370, and the like.

The operation unit 330 is an input device constituted by operation keys, button switches or the like, and outputs an operation signal corresponding to a user's operation to the CPU 320.

The ROM 340 is a storage unit that stores programs, data, and the like for causing the CPU 320 to perform various calculation processes and control processes.

The RAM 350 is a storage unit which is used as a work area of the CPU 320 and temporarily stores programs or data which is read out from the ROM 340, data which is input from the operation unit 330, results of computation executed by the CPU 320 in accordance with various programs, and the like.

The communication unit 360 performs a variety of control for establishing data communication between the CPU 320 and an external device.

The display unit 370 is a display device constituted by a liquid crystal display (LCD) and the like, and displays various pieces of information on the basis of a display signal which is input from the CPU 320. The display unit 370 may be provided with a touch panel functioning as the operation unit 330.

The CPU 320 can perform various processes on the basis of an oscillation signal having a small frequency deviation (high frequency accuracy) by applying, for example, the oscillators 1 according to the above-described embodiments as the oscillator 310 or applying the temperature compensated oscillation circuits 2 according to the above-described embodiments as the temperature compensated oscillation circuit 312, and thus it is possible to realize the electronic apparatus with high reliability.

Various electronic apparatuses are considered as the electronic apparatus 300, and examples of the electronic apparatus include a personal computer (for example, mobile-type personal computer, laptop personal computer, or tablet personal computer), a mobile terminal such as a smart phone or a cellular phone, a digital still camera, an ink jet ejecting apparatus (for example, ink jet printer), a storage area network device such as a router or a switch, a local area network device, a device for a vehicle terminal base station, a television, a video camera, a video recorder, a car navigation device, a real-time clock device, a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, electronic thermometer, sphygmomanometer, blood glucose monitoring system, electrocardiogram measurement device, ultrasound diagnostic device, and electronic endoscope), a fish finder, various types of measuring apparatuses, meters and gauges (for example, meters and gauges of a vehicle, an aircraft, and a vessel), a flight simulator, a head mounted display, a motion tracer, a motion tracker, a motion controller, PDR (pedestrian position and direction measurement), and the like.

An example of the electronic apparatus 300 according to this embodiment is a transmission device functioning as a device for a terminal base station which communicates with a terminal in a wired or wireless manner, and the like by using the oscillator 310 mentioned above as a reference signal source. For example, the oscillators 1 according to the above-described embodiments are applied as the oscillator 310, and thus it is also possible to realize the electronic apparatus 300, required to have high frequency accuracy, high performance, and high reliability, which is usable in, for example, a communication base station and the like at a lower cost than in the related art.

In addition, another example of the electronic apparatus 300 according to this embodiment may be a communication device including a frequency control unit in which the communication unit 360 receives an external clock signal and the CPU 320 (processing unit) controls the frequency of the oscillator 310 on the basis of the external clock signal and an output signal (internal clock signal) of the oscillator 310. The communication device may be a backbone network apparatus such as a stratum 3, or a communication apparatus which is used in a femtocell.

3. Vehicle

Figure 18:
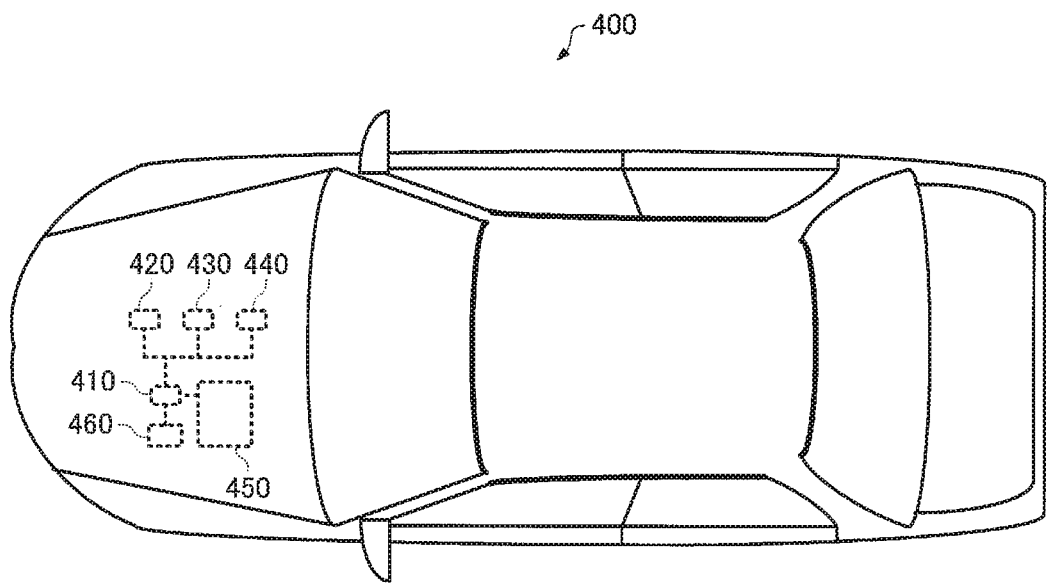
FIG. 18 is a diagram illustrating an example of a vehicle according to this embodiment.

FIG. 18 is a diagram (top view) illustrating an example of a vehicle according to this embodiment. A vehicle 400 illustrated in FIG. 18 is configured to include an oscillator 410, controllers 420, 430, and 440 that perform a variety of control of an engine system, a brake system, a keyless entry system and the like, a battery 450, and a backup battery 460. Meanwhile, the vehicle according to this embodiment may be configured such that a portion of components (respective units) of FIG. 18 is omitted or changed or other components are added.

The oscillator 410 includes a temperature compensated oscillation circuit and a resonator which are not shown in the drawing, and the temperature compensated oscillation circuit oscillates the resonator to generate an oscillation signal. The oscillation signal is output to the controllers 420, 430, and 440 from an external terminal of the oscillator 410, and is used as, for example, a clock signal.

The battery 450 supplies power to the oscillator 410 and the controllers 420, 430, and 440. The backup battery 460 supplies power to the oscillator 410 and the controllers 420, 430, and 440 when an output voltage of the battery 450 becomes lower than a threshold value.

The controllers 420, 430, and 440 can perform a variety of control on the basis of an oscillation signal having a small frequency deviation (high frequency accuracy), for example, by applying the oscillators 1 according to the above-described embodiments as the oscillator 410 or applying the temperature compensated oscillation circuit 2 according to the above-described embodiments as a temperature compensated oscillation circuit included in the oscillator 410, and thus it is possible to realize the vehicle with high reliability.

Various vehicles are considered as the vehicle 400, and examples of the vehicle include an automobile (including an electric automobile), an aircraft such as a jet engine airplane or a helicopter, a vessel, a rocket, a satellite, and the like.

The invention is not limited to this embodiment, and various modifications can be made without departing from the scope of the invention.

The above-described embodiments and modification example are just examples, and are not limited thereto. For example, the embodiments and modification can be appropriately combined with each other.

The invention includes configurations (for example, configurations having the same functions, methods and results, or configurations having the same objects and effects) which are substantially the same as the configurations described in the above embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations that known techniques are added to the configurations described in the embodiments.

The entire disclosure of Japanese Patent Application No. 2016-113223, filed Jun. 7, 2016 is expressly incorporated by reference herein.

What is claimed is:

1. A temperature compensated oscillation circuit comprising:
    an oscillation circuit that oscillates a resonator;
    a first terminal that is connected to the oscillation circuit and receives an output signal of the resonator;
    a second terminal separate from the first terminal;
    a fractional N-PLL circuit that multiplies frequency of an oscillation signal which is output by the oscillation circuit, based on a frequency division ratio which is input;
    a temperature measurement unit that measures temperature; and
    a storage unit that stores a temperature correction table for correcting frequency temperature characteristics of the oscillation signal,
    a control unit configured to set an update mode for updating the temperature correction table; and
    a temperature correction table updating unit configured to update the temperature correction table in the update mode based on an output signal of the fractional N-PLL circuit and a reference clock signal which is input from the second terminal,
    wherein the frequency division ratio of the fractional N-PLL circuit is set based on a measurement value obtained by the temperature measurement unit and the temperature correction table.

2. The temperature compensated oscillation circuit according to claim 1,
    wherein the temperature correction table updating unit calculates the frequency division ratio for bringing frequency of the output signal of the fractional N-PLL circuit close to frequency of the reference clock signal in the update mode, and updates the temperature correction table based on the frequency division ratio.

3. The temperature compensated oscillation circuit according to claim 1, further comprising:
    a frequency division ratio calculation unit that calculates the frequency division ratio corresponding to the measurement value obtained by the temperature measurement unit by using a plurality of the frequency division ratios described in the temperature correction table, in a case where the frequency division ratio corresponding to the measurement value is not described in the temperature correction table.

4. The temperature compensated oscillation circuit according to claim 2, further comprising:
    a frequency division ratio calculation unit that calculates the frequency division ratio corresponding to the measurement value obtained by the temperature measurement unit by using a plurality of the frequency division ratios described in the temperature correction table, in a case where the frequency division ratio corresponding to the measurement value is not described in the temperature correction table.

5. An oscillator comprising:
    the temperature compensated oscillation circuit according to claim 1; and
    the resonator.

6. An oscillator comprising:
    the temperature compensated oscillation circuit according to claim 2; and
    the resonator.

7. An oscillator comprising:
    the temperature compensated oscillation circuit according to claim 3; and
    the resonator.

8. An electronic apparatus comprising the oscillator according to claim 4.

9. An electronic apparatus comprising the oscillator according to claim 5.

10. A vehicle comprising the oscillator according to claim 4.

11. A vehicle comprising the oscillator according to claim 5.

12. A method of manufacturing an oscillator, the method comprising:
    assembling the oscillator that includes a terminal, a resonator, and a temperature compensated oscillation circuit, the temperature compensated oscillation circuit that includes an oscillation circuit that oscillates the resonator, a first terminal that is connected to the oscillation circuit and receives an output of the resonator, a second terminal separate from the first terminal, a fractional N-PLL circuit that multiplies frequency of an oscillation signal which is output by the oscillation circuit based on a frequency division ratio which is input, a temperature measurement unit that measures temperature, a storage unit that stores a temperature correction table for correcting frequency temperature characteristics of the oscillation signal, a control unit that is capable of setting an update mode for updating the temperature correction table, and a temperature correction table updating unit that updates the temperature correction table based on an output signal of the fractional N-PLL circuit and a reference clock signal which is input from the second terminal, wherein the frequency division ratio of the fractional N-PLL circuit being set based on a measurement value obtained by the temperature measurement unit and the temperature correction table;

setting the temperature compensated oscillation circuit to be in the update mode; and changing a temperature of the oscillator in a predetermined range while inputting the reference clock signal to the terminal to thereby change temperature of the oscillator in a predetermined range.

* * * * *